(12) United States Patent
D'Souza et al.

(10) Patent No.: US 9,088,293 B1
(45) Date of Patent: Jul. 21, 2015

(54) CALIBRATION OF A TIME-INTERLEAVED ANALOG-TO-DIGITAL CONVERTER (ADC) CIRCUIT

(71) Applicant: SEMTECH CORPORATION, Camarillo, CA (US)

(72) Inventors: Sandeep Louis D'Souza, San Diego, CA (US); Kenneth Colin Dyer, Pleasanton, CA (US)

(73) Assignee: SEMTECH CORPORATION, Camarillo, CA (US)

( * ) Notice: Subject to any disclaimer, the term of this patent is extended or adjusted under 35 U.S.C. 154(b) by 0 days.

(21) Appl. No.: 14/477,768

(22) Filed: Sep. 4, 2014

(51) Int. Cl.
  *H03M 1/10* (2006.01)
  *H03M 1/12* (2006.01)
  *H03M 1/08* (2006.01)

(52) U.S. Cl.
  CPC .......... *H03M 1/1028* (2013.01); *H03M 1/0836* (2013.01); *H03M 1/121* (2013.01)

(58) Field of Classification Search
  None
  See application file for complete search history.

(56) References Cited

U.S. PATENT DOCUMENTS

| | | | | |
|---|---|---|---|---|
| 5,239,299 A | * | 8/1993 | Apple et al. | 341/118 |
| 6,900,750 B1 | * | 5/2005 | Nairn | 341/118 |
| 7,250,885 B1 | * | 7/2007 | Nairn | 341/141 |
| 7,839,313 B2 | * | 11/2010 | Kidambi | 341/118 |
| 2012/0075129 A1 | * | 3/2012 | Kidambi | 341/118 |

OTHER PUBLICATIONS

Vogel, Christian; Thesis: Modeling, Identification, and Compensation of Channel Mismatch Errors in Time-Interleaved Analog-to-Digital Converters, Graz University of Technology, Graz, Austria; Jul. 2005.*
El-Chammas, et al., "A 12-GS/s 81-mW 5-bit Time-Interleaved Flash ADC With Background Timing Skew Calibration," IEEE Journal of Solid State Circuits, Apr. 2011, vol. 46, No. 4.
Dyer, et al., "An Analog Background Calibration Technique for Time-Interleaved Analog-to-Digital Converters," IEEE Journal of Solid State Circuits, Dec. 1998, vol. 33, No. 12.
Silay, et al., Slide Presentation "Rubicon 2 Interleaver: Timing mismatch in a two-channel charge mode interleaver," Jan. 9, 2014, 12 slides.
Silay, et al., Slide Presentation "Rubicon 2 Interleaver: Timing mismatch in a two-channel charge mode interleaver—Supplementary Slides," Jan. 16, 2014, 25 slides.

* cited by examiner

*Primary Examiner* — Howard Williams
(74) *Attorney, Agent, or Firm* — McDermott Will & Emery LLP

(57) ABSTRACT

Examples are provided for a method and apparatus for calibration of an analog-to-digital converter (ADC). The method includes selecting a reference sub-ADC from multiple sub-ADCs. A calibration signal is sent to an input node of each sub-ADC of the sub-ADCs. For each sub-ADC, other than the reference sub-ADC, a corresponding error signal is generated based on output signals of the sub-ADC and the reference sub-ADC. Each sub-ADC is calibrated based on the corresponding error signal. The ADC may be a time-interleaved ADC that includes the plurality of sub-ADCs, and the reference sub-ADC has a lowest relative offset among the sub-ADCs.

20 Claims, 14 Drawing Sheets

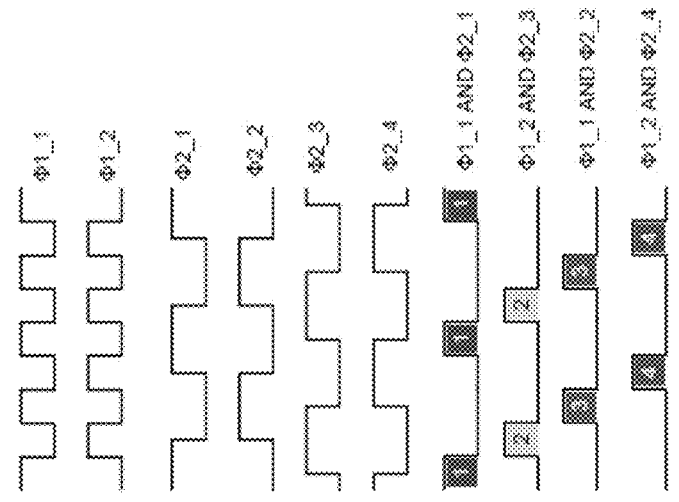
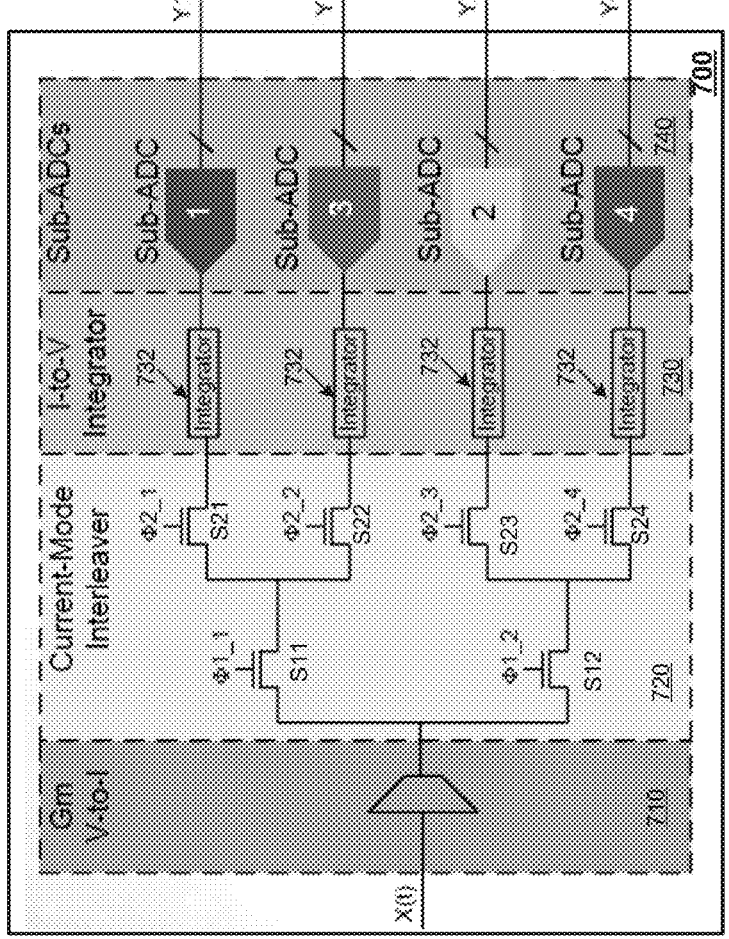 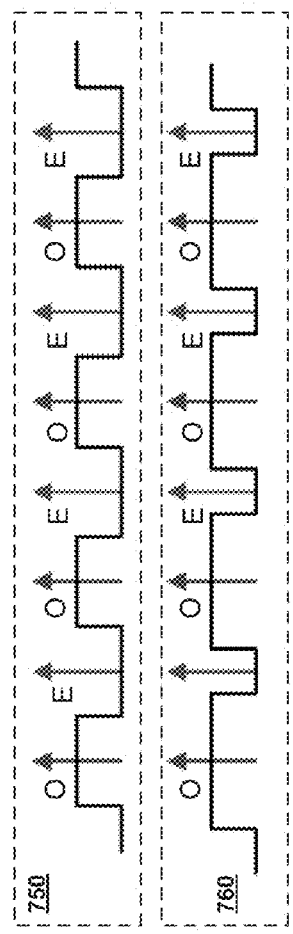
FIG. 7A
FIG. 7B
FIG. 7C

CALIBRATION OF A TIME-INTERLEAVED ANALOG-TO-DIGITAL CONVERTER (ADC) CIRCUIT

FIELD

The disclosure relates in general to mixed signal systems, and more particularly, for example, to calibration of a time-interleaved analog-to-digital converter (ADC) circuit.

BACKGROUND

High speed analog-to-digital converters (ADCs) can be used in advanced communication systems which include, for example, the 100 Gb/s and faster coherent optical transceivers and phased-array radar systems. High speed ADCs may be implemented by time-interleaving multiple (e.g., 128 or more) ADCs. For instance, by interleaving N ADCs, a combined sampling rate (e.g., Fs) that is N time the sampling rate of each of the ADCs may be achieved. However, impairments such as channel-to-channel gain-mismatch, offset-mismatch and non-uniform sampling-time impairments may result in degraded low spurious-free-dynamic-range (SFDR), and signal-to-noise-and-distortion-ratio (SNDR).

The channel-to-channel (e.g., between ADC channels) mismatch may include offset-mismatch, gain-mismatch, and sampling-time mismatch. The offset-mismatch, for example, can cause spurious continuous-wave (CW) unmodulated tones to appear at frequencies corresponding to multiples (e.g., 0 1 2 ... (N−1)) of the Fs/N ratio. The gain mismatch, for instance, can result in amplitude-modulated (AM) sidebands generated from mixing of the input signal with different signal-path gains associated with each individual sub-ADC channel, whereas the sampling-time mismatch can cause frequency-dependent phase-modulation of the input signal because of different sampling-times associated with each individual sub-ADC channel. Existing solutions for mitigating these impairments are by design, at the analog circuit level. This often leads to large chip-area, high cost, high power-consumption, and undesired high design-complexity.

The description provided in the background section, including without limitation, any problems, features, solutions or information, should not be assumed to be prior art merely because it is mentioned in or associated with the background section. The background section may include information that describes one or more aspects of the subject technology.

SUMMARY

In one aspect of the disclosure, example methods and apparatus are provided for calibration of time-interleaved analog-to-digital converters (ADCs). The calibrations of the subject technology meet the ADC's performance targets such as effective number-of-bits (ENOB), spurious-free-dynamic-range (SFDR), signal-to-noise-and-distortion-ratio (SNDR), and other performance targets. These calibrations can be performed with advantageous features including, but not limited to, not degrading baseline performance (e.g., using minimally invasive sense and control features that are not disruptive to sensitive high-speed analog circuits), flexibility in working with many design architectures and circuit implementations, robustness (e.g., having stable feedback circuit paths and using algorithms that are free from convergence issues), and minimal overhead (e.g., additional chip-area, power consumption, and circuit complexity). The disclosed solutions can take advantage of the compact digital circuit capability of deep-submicron processes CMOS processes (e.g., 32 nm silicon-on-insulator (SOI) process with a gate density of approximately 2 million gates/mm$^2$). The subject technology can further expand the product's design space across both analog blocks and digital calibration, with block performance driven on-demand by the system requirements (e.g., without over-design such as inclusion of unnecessary parts and elements).

One or more implementations of the subject disclosure are illustrated by and/or described in connection with one or more figures and are set forth in the claims.

The description in this summary section may provide some illustrative examples of the disclosure. This section is not intended to be a broad overview or to identify essential elements of the disclosure.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

BRIEF DESCRIPTION OF THE DRAWINGS

FIGS. 7A through 7C are an architectural diagram of an example of a current-mode interleaver and corresponding timing diagrams.

DETAILED DESCRIPTION

Figure 2:
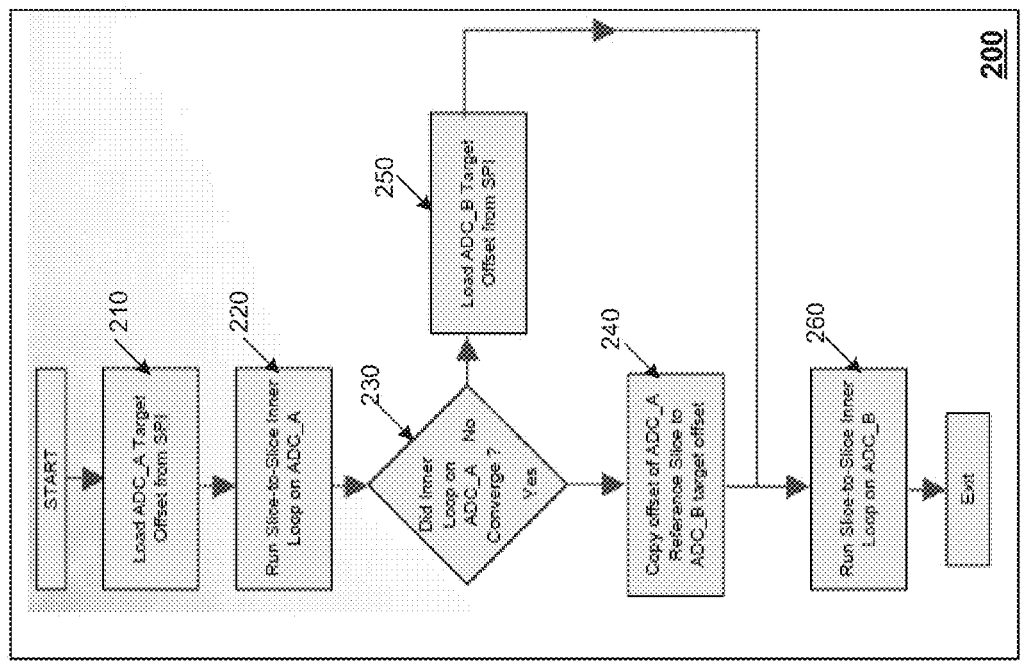
FIG. 2 is a flow diagram of an example of a method for an outer-loop calibration.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding. Please note that the term "example" is used herein as a noun or an adjective.

In one or more aspects, the subject technology is directed to methods and implementations for calibration of an analog-to-digital converter (ADC) to mitigate ADC impairments including offset and gain mismatches. In some aspects, the ADC may be a time-interleaved, ultra-high speed ADC envisioned for advanced communication systems including, for example, 100 Gb/s and faster coherent optical transceivers and phased array radar systems. The ADC may be implemented with a number of (e.g., N such as 128) time-interleaved sub-ADCs to achieve a sampling rate that is N times higher than that of the individual sub-ADCs.

The mismatches between various sub-ADCs, such as gain and offset mismatches, and non-uniform sample-timing impairments, however, may result in degraded signal-to-noise and distortion ratio (SNDR) and spurious-free dynamic range (SFDR) values. For example, the offset mismatch may cause creation of spurious continuous-wave (CW) unmodulated tones (e.g., at 0, 1, 2 ... (N−1) times the sampling rate ($F_s$/N) of each sub-ADC). The gain mismatch, for instance, can result in unwanted amplitude modulated (AM) sidebands of an input signal mixed with tones at frequencies at 0, 1, 2 ... (N−1) times ($F_s$/N). Further, the sampling-time mismatch may lead to frequency-dependent mixing of the input signal with tones at frequencies at 0, 1, 2 ... (N−1) times ($F_s$/N). Mitigating these impairments by design at an analog circuit level requires stringent analog specifications that results in large chip-area, high power-consumption, and high design-complexity.

In one or more implementations, the subject technology alleviates impairments associated with the gain-mismatches and offset-mismatches, and non-uniform sampling-time impairments by calibration that meets the ADC's effective number of bits (ENOB), SFDR, and other performance targets. The disclosed calibration solutions are minimally invasive in terms of the applied sensing and controlling mechanism and do not disrupt sensitive high-speed analog circuits. Further, the subject technology provides a robust solution with no convergence issues in the applied algorithms and with stable feedback circuit paths that works with an arbitrary architecture and circuit implementation with minimal overhead (e.g., chip area, power consumption, or circuit complexity). In one or more implementations, the subject technology includes a number of advantageous features. For example, it can take full advantage of the compact digital circuit capability of the deep sub-micron CMOS processes (e.g., 32 nm silicon-on-insulator (SOI) process with a gate density of ~2 million gates/mm²). The disclosed solution can expand design space across both analog circuit blocks and digital calibration. In this way block performance can be driven on-demand by the system (e.g., not overdesigned).

Figure 1:
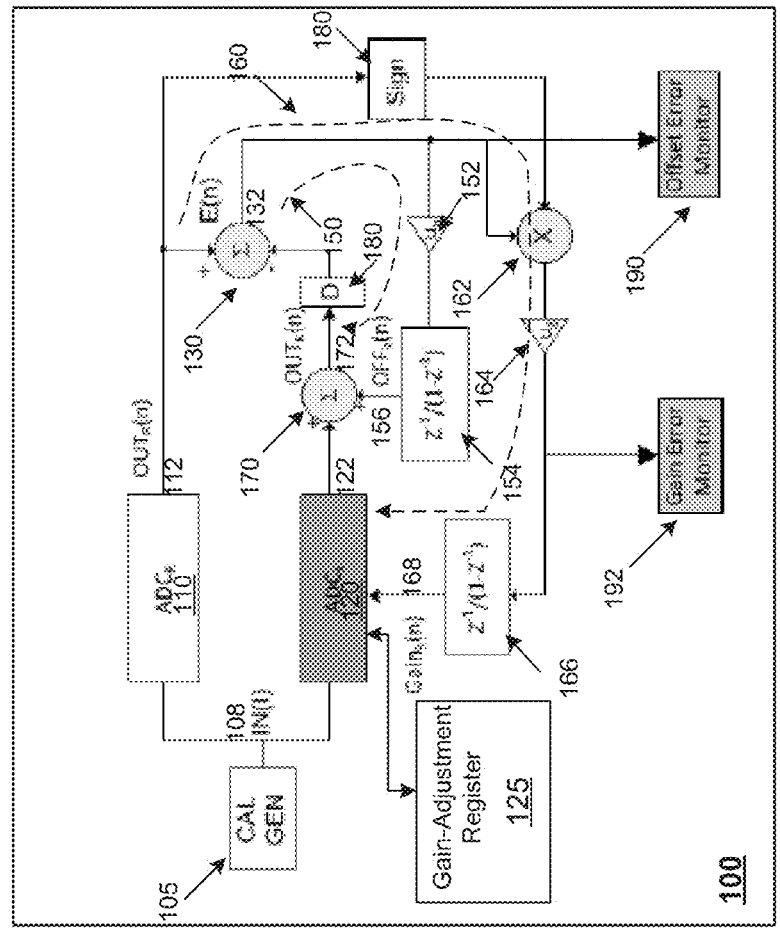
FIG. 1 is an architectural diagram of an example of an apparatus for calibration of a time-interleaved analog-to-digital converter (ADC).

FIG. 1 is an architectural diagram of an example of an apparatus 100 for calibration of a time-interleaved ADC. The ADC may include a number of (e.g., N such as 128) sub-ADCs, an example of which is shown as the ADC 120 (e.g., $ADC_k$). The apparatus 100 calibrates gain and offset of the ADC 120 (e.g., a sub-ADC under-calibration) relative to a reference sub-ADC 110, which is selected from the sub-ADCs to serve as a reference for gain and offset calibration of the remaining sub-ADCs. In a single-ended ADC implementation (e.g., where the ADC has a single analog input), to select the reference sub-ADC 110 from the sub-ADCs, an input node of each sub-ADC is shorted to ground potential and then an offset of that sub-ADC is measured. The sub-ADC with the lowest offset (e.g., with respect to a target offset) is selected as the reference sub-ADC 110. In a differential ADC implementation (e.g., where the ADC has a pair of complementary positive and negative differential inputs), the two differential (e.g., positive and negative) inputs to the ADC are shorted to each other and the offset of the sub-ADC is measured.

The apparatus 100 performs gain and offset calibration of the sub-ADC 120 through a sequence of measurements performed using a gain-correction path 160 and an offset-correction path 150 and a calibration-signal 108 (e.g., IN(t)) generated by a calibration-signal generator 105. For example, in an nth measurement sequence (e.g., iteration) of a calibration loop, in a summation block 130, an output signal 172 (e.g., $OUT_k(n)$) of the summation block 170, which is stored in a memory element (e.g., a Flip-flop) 180, is subtracted from an output 112 (e.g., $OUT_R(n)$) of the reference ADC 110 to generate an error signal 132. The offset-correction path 150 and the gain-correction path 160 act to minimize the difference between the output signal 112 of the reference sub-ADC 110 and the output signal 122 of the sub-ADC 120 in the mean-square sense. The offset-correction path 150 includes a multiplier 152 and an error accumulator 154. The multiplier 152 multiplies the error signal 132 by a quantized fraction (e.g., 0.01) and passes the result to the error accumulator 154 that generates an offset-error signal 156 (e.g., $OFF_k(n)$). The offset-error signal 156 is added, in the summation block 170, to the output signal 122 of the sub-ADC 120 to generate the output signal 172. After a number of sequences of measurements, the offset-error correction loop of the calibration loop converges and the offset-error signal 156 approaches a constant value (e.g., nearly zero), which is the estimated offset-mismatch of the sub-$ADC_K$ under calibration relative to the reference sub-$ADC_R$.

The gain-correction path 160 includes a sign block 180, a multiplication block 162, a multiplier 164 and an accumulator 166. The sign block 180 derives the sign of the output signal 112 and generates a sign signal (e.g., +1 or −1), which is then multiplied through the multiplication block 162 by the error signal 132 to generate an absolute value of the error signal 132. The absolute value of the error signal 132 is then multiplied by a quantized fraction (e.g., in block 164) and the result is passed to the error accumulator 166 that generates a gain-error signal 168 (e.g., $Gain_k(n)$). The gain-error signal 168 is used to digitally adjust the gain of the sub-ADC 120. In some aspects, the gain of the sub-ADC 120 is corrected by adjusting a reference voltage of the sub-ADC 120, for example, by changing input digital codes to a gain-adjustment digital-to-analog converter (DAC) that generates the reference voltage for the sub-ADC. In this way, the gain correction including the modified input digital code to the gain-adjustment DAC can be stored in gain-adjustment register 125 and retrieved at a later time. It is understood that the gain-correction and offset-correction loops can be performed concurrently. The operation of the apparatus 100 through various measurement sequences can be further understood from the update equations below:

$$\text{OFF}_k(n) = \text{OFF}_k(n-1) + \mu_O * E(n) \quad (1)$$

$$\text{Gain}_k(n) = \text{Gain}_k(n-1) + \mu_G * E(n) * \text{Sign}(\text{OUT}_R(n)) \quad (2)$$

$$E(n) = \text{OUT}_R(n) - \text{OUT}_k(n) \quad (3)$$

Where $\mu_O$ and $\mu_G$ are step sizes (e.g., quantization factors) and can control convergence speed, stability and accuracy of the calibrations and, in some implementations, can be controlled by software.

In one or more implementations, for better stability and convergence, the calibration signal 108 has at least two distinct values. The calibration signal 108 has to include white noise to enable the calibration loops to match the ADC channels (e.g., sub-ADCs) below the LSB level. Examples of the calibration signal 108 include a square wave with added white noise.

In some aspects, an offset-error monitor block 190 and a gain error-monitor block 192 can automatically detect a convergence of the offset-correction loop and the gain-correction loop respectively, as described in more detail below.

FIG. 2 is a flow diagram of an example of a method 200 for ADC-to-ADC calibration. In addition to the inter-sub ADC calibration (e.g., inner-loop) explained above with respect to FIG. 1, the subject technology allows for calibrating between two or more time-interleaved ADCs (e.g., outer-loop calibration). The example outer-loop calibration as shown in method 200 compares two ADCs (e.g., ADC-A and ADC-B), each of which is a time-interleaved ADC comprising of two or more sub-ADCs. The method 200 starts with loading a target offset values for the ADC-A from an interface (e.g., a serial-to-parallel interface (SPI)) (210). Next, an inner loop calibration between sub-ADCs (e.g., slices) of ADC-A is performed (220). In a control block 230, if the inner loop calibration of ADC-A converged, the offset of the reference sub-ADC of the ADC-A is used as a target offset for ADC-B (240). Otherwise, a target offset for ADC-B is loaded from the SPI (250). Next, an inner loop calibration is performed for the ADC-B using the target offset for ADC-B (260), which concludes the method 200.

Figure 3A:
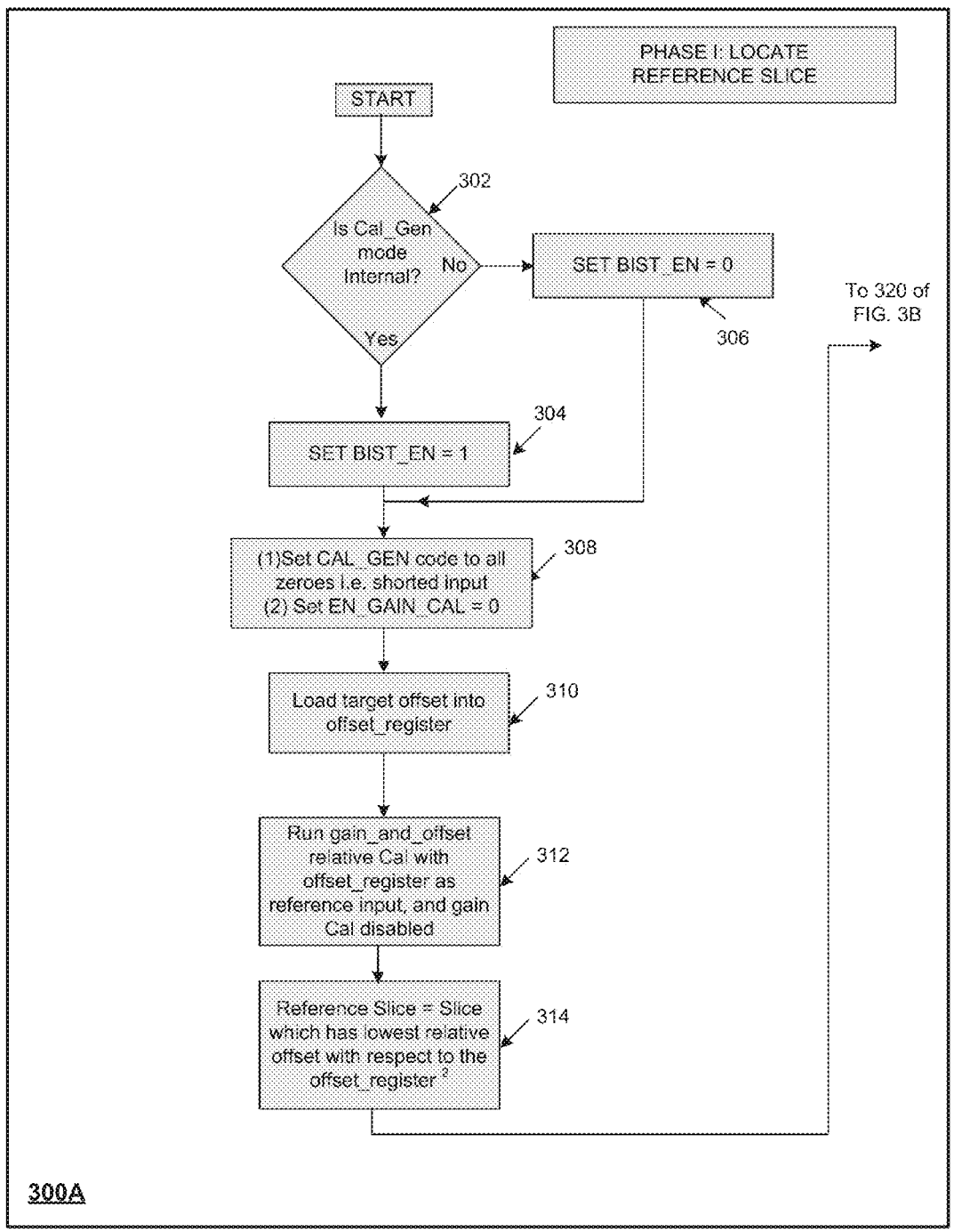
FIGS. 3A through 3C are flow diagrams of an example of a method for an inner loop calibration.
Figure 3B:
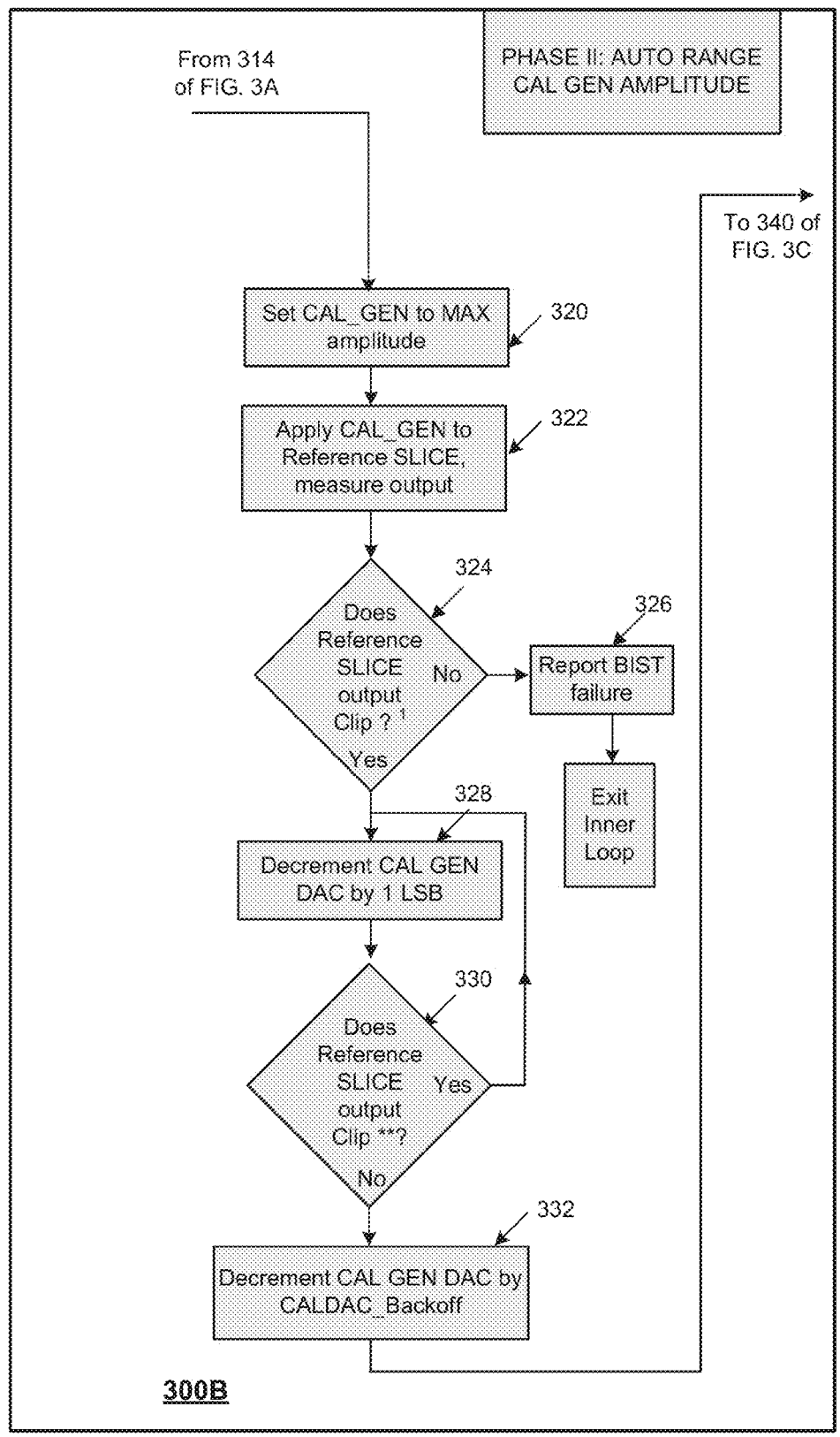
Figure 3C:
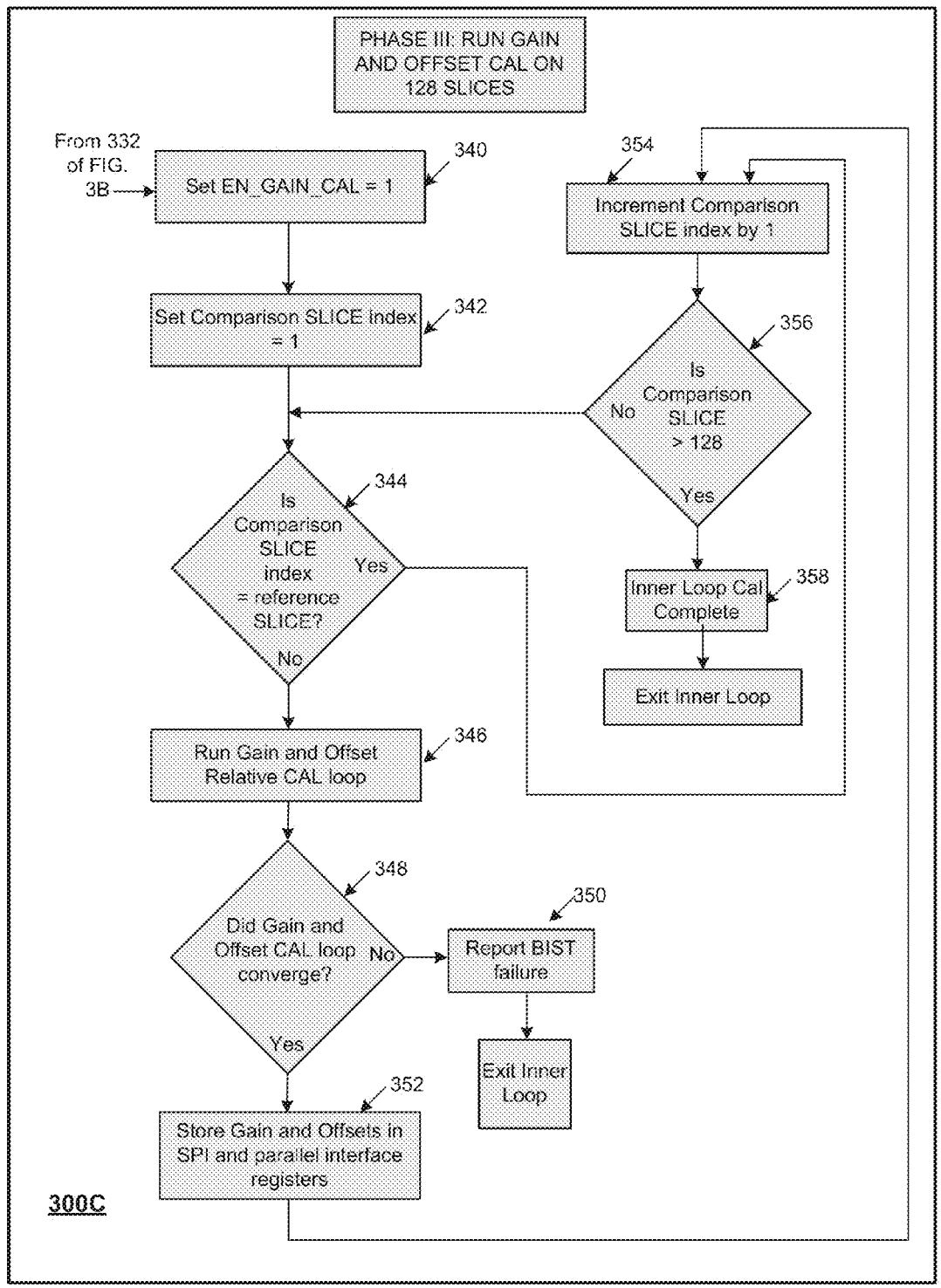

FIGS. 3A through 3C are flow diagrams of an example of a method for inter-loop calibration. The flow diagram 300A of FIG. 3A, 300B of FIG. 3B, and 300C of FIG. 3C, respectively show three different phases of the inner loop calibration. The flow diagram 300A, for example, illustrates the reference sub-ADC (e.g., slice) selection process, among a number of (e.g., 128) sub-ADCs, in which zero differential inputs are applied to all the sub-ADCs and offset calibration is run to find a sub-ADC that has an offset that is closest to the target offset value. This sub-ADC is designated as the reference sub-ADC. The reference sub-ADC selection process starts with control block 302 where it is determined whether the calibration-signal-generator mode (e.g., Cal-Gen mode) is internal or not. If the Cal-Gen mode is internal, BIST is enabled (304), otherwise, BIST is disabled (306). Next, the Cal-Gen code is set to all zeros and gain calibration is disabled (308). In a single-ended ADC implementation (e.g., where the ADC has a single analog input), setting the Cal-Gen code such that it results in shorting the single-ended inputs of all sub-ADCs to ground potential. Alternatively, in a differential ADC implementation (e.g. where the ADC has a pair of complementary positive and negative differential inputs), setting the Cal-Gen code such that it results in shorting the positive and negative input in the differential pair of inputs of each sub-ADC to each other. The target offset is loaded into an offset-register (e.g., 125 of FIG. 1) (310), and then offset calibration is performed, while the gain calibration is disabled (312). The reference sub-ADC is then selected as the sub-ADC that has the lowest relative offset with respect to the target offset stored in the offset-register.

The flow diagram 300B illustrates an auto-range operation which sets the calibration-signal-generator (Cal-Gen) amplitude, and which follows block 314 of FIG. 3A. Initially, the Cal-Gen amplitude is set to a maximum level (320) and applied to the reference sub-ADC selected in the flow diagram 300A, and a corresponding output signal is measured (322). Next it is determined whether the reference sub-ADC is clipped by the Cal-Gen signal with maximum amplitude (324) (e.g., application of the Cal-Gen signal with maximum amplitude as input to the sub-ADC causes the output of the reference sub-ADC to saturate at its maximum positive or negative output code). If the reference sub-ADC is not clipped, the event is reported as a BIST failure (326) and the inner loop calibration is exited. Otherwise, the Cal-Gen amplitude is decremented (e.g., by one LSB) (328), and it is determined whether the reference sub-ADC is clipped or not (330). If the reference sub-ADC is clipped, control is passed to block 328. Otherwise, Cal-Gen amplitude is decremented (e.g., by one LSB) (332) and the next process of gain and offset calibration method 300C is started using the selected reference sub-ADC selected in the method 300A and the Cal-Gen amplitude selected in method 300B.

The method 300C starts with enabling the gain-error correction loop (e.g., by setting EN-GAIN-CAL=1) (340). Next, a comparison sub-ADC index (e.g., an index associated with a sub-ADC or slice under calibration) is set to one (342), and it is determined whether the comparison sub-ADC index is equal to the reference sub-ADC (e.g., an index associated with a reference slice) (344). If the comparison sub-ADC index is equal to the reference sub-ADC, control is passed to step 354. Otherwise, gain and offset correction loops are performed (346), and it is determined whether these loops converged (348). If the loops did not converge, the event is reported as a BIST failure (350) and the inner loop is exited. Otherwise, gain and offset values are stored in registers (e.g., interface registers or SPI) (352) and the comparison sub-ADC index is incremented by one (354), so that the next under-calibration sub-ADC can be selected. Then it is determined whether the comparison sub-ADC index is greater than 128 (356). If the comparison sub-ADC index is greater than the number of sub-ADCs in the time-interleaved ADC, e.g., 128, the inner loop calibration is complete (358) and is exited. Otherwise, the control is passed to block 344 for the calibration to continue.

Figure 4:
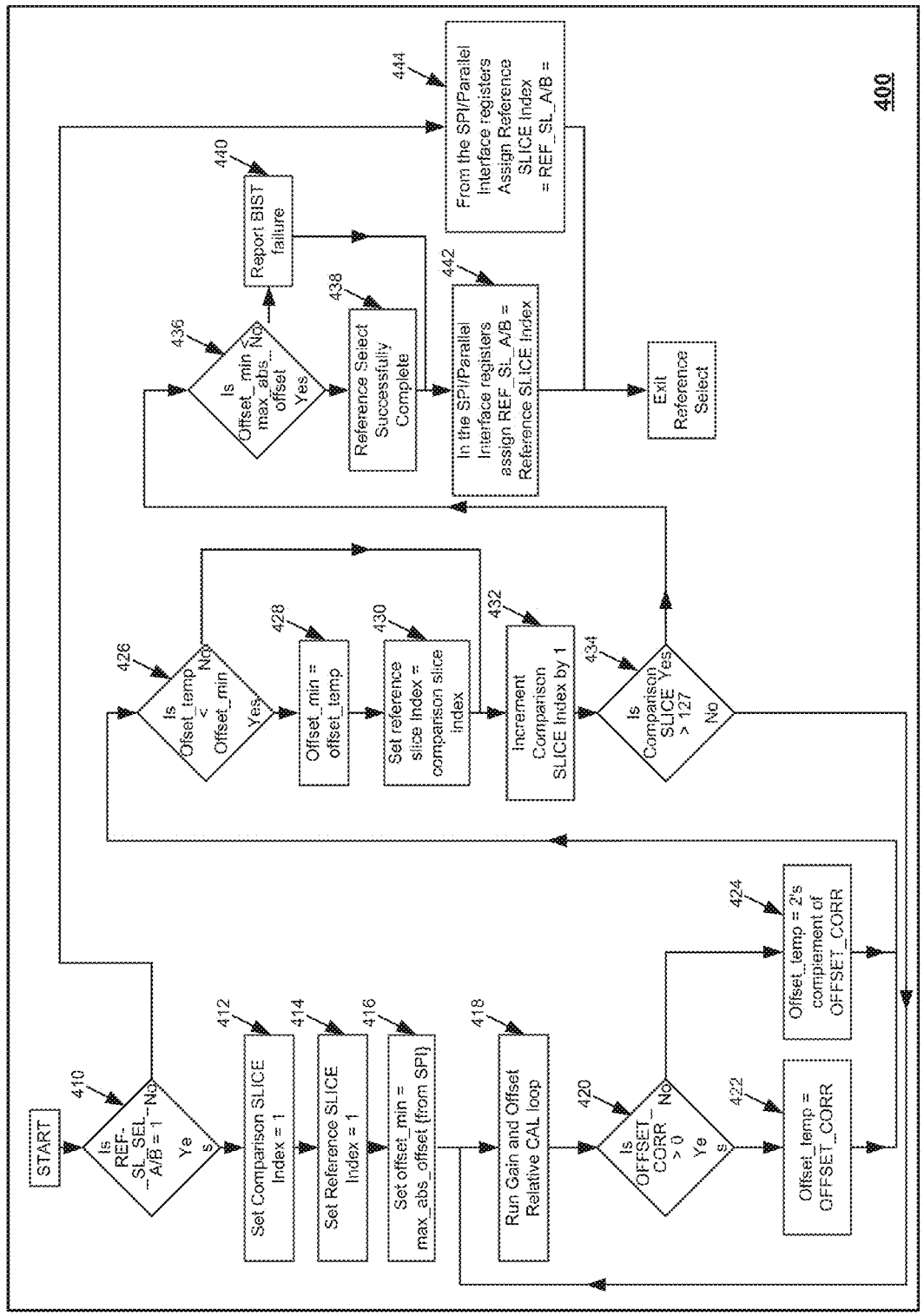
FIG. 4 is a flow diagram of an example of a method for selection of the reference sub-ADC of FIG. 1.

FIG. 4 is a flow diagram of an example of a method 400 for selection of the reference sub-ADC of FIG. 1. The method 400 is similar to the method 300A of FIG. 3A, except that includes some more detailed information. As explained above, in the reference sub-ADC selection process the gain-calibration loop is turned off and only offset-calibration loop is active. The method 400 starts with determining whether for any of ADC-A or ADC-B the reference sub-ADC selection index (e.g., REF-SL-SEL) is set to one (410). If the answer is no, the control in passed to block 444, where a reference sub-ADC selection index is assigned from an interface (e.g., a SPI) and the method exits the reference selection. Otherwise, comparison sub-ADC index is set to one (412), and the reference sub-ADC index is also set to one (414).

Next, the minimum offset (e.g., offset_min) is set equal to a maximum absolute offset parameter (e.g., max_abs_offset) obtained from an interface (e.g., SPI) (416), and calibration loop is run and a value for offset correction (e.g., OFFSET_CORR) is determined (418). If the offset correction is positive, then a temporary offset value (e.g., offset_temp) is set equal to the offset correction (422), otherwise, the temporary offset value is set equal to 2's complement of the offset correction (424). Next, it is determined whether the temporary offset value is smaller than the minimum offset (426). If the answer is yes, the minimum offset is set equal to the temporary offset parameter (428), and the reference sub-ADC index is set equal to comparison sub-ADC index (430). Otherwise, the control is passed to a block 432, where the comparison sub-ADC index is incremented by one (432).

Next, it is determined whether the comparison sub-ADC index is greater than 127 (434), and if the comparison sub-ADC index is not greater than 127 the control is passed to block 418. Otherwise, the determinations is made whether the minimum offset is less than the maximum absolute offset (436), and if the answer is yes, reference sub-ADC selection is successfully completed (438) and control is passed to block 442. Otherwise, the event is reported as a BIST failure (440) and control is passed to block 442. Next in block 442, reference sub-ADC selection index is set equal to the reference sub-ADC index (442) in parallel interface registers or SPI, and the reference section is exited.

Figure 5:
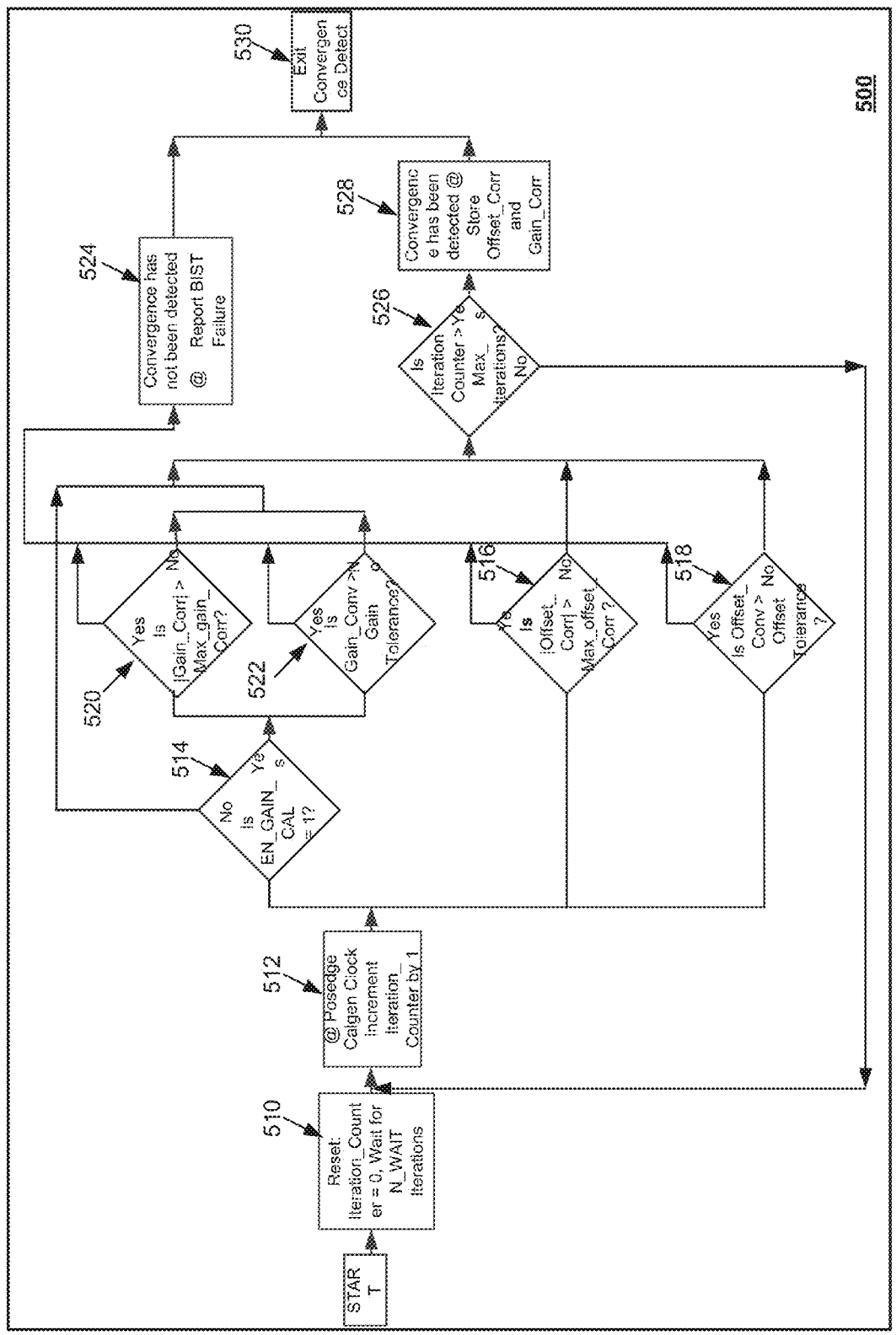
FIG. 5 is a flow diagram of an example of a method for detection of the convergence of the calibration loops.

FIG. 5 is a flow diagram of an example of a method 500 for detection of the convergence of the calibration loops. The gain and offset calibration of the subject technology is performed automatically without any user intervention. Therefore, it is prudent that the convergence of the gain and offset calibration loops be detected automatically. Depending on the extent of the calibrations performed, the convergence may take a number of cycles (e.g., 150). The convergence detection method 500 starts by initializing an iteration counter parameter (e.g., Iteration_Counter) to zero and waiting for a specified number of cycles (e.g., N_WAIT, a programmable parameter) of iterations (510) before checking if the offset-calibration and gain-calibration loops have converged.

Next, the iteration counter parameter in incremented by one (e.g., at a positive (rising) edge of a calibration-signal-generator output waveform) (512), and a determination is made whether the gain calibration is to be performed (514). If the answer is no, the gain convergence check block 520 and 522 are skipped and the control is passed to block 526. Otherwise, in two parallel blocks 520 and 522 it is made sure that that an absolute value of the gain correction has not reached a maximum value and gain convergence has not exceeded the gain tolerance, where gain convergence is the change in gain correction from one iteration cycle to the next, before checking whether the iteration counter has reached the expected number of cycles in block 526. In case the absolute value of the gain correction has reached the maximum value and/or the gain convergence has exceeded the gain tolerance, the failure is reported as the BIST failure (524). Similar checks as in blocks 520 and 522 are performed for the offset calibration in blocks 516 and 518, and if no failure is detected, control is passed to block 526, where it is checked whether the iteration counter has reached the expected number of cycles. If the answer is yes, the convergences have been detected and the current values of offset correction and gain correction are stored (528) and the convergence detection process is exited. Otherwise, control is passed to block 512 for convergence detection process to continue.

Figure 6A:
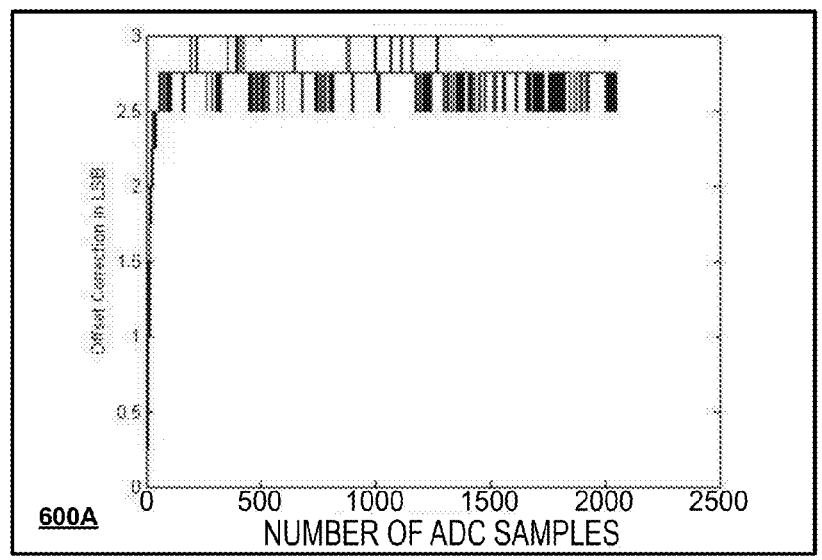
FIGS. 6A through 6C are diagrams illustrating convergence of the examples of offset-mismatches and gain-mismatches and post-calibration ADC error.
Figure 6B:
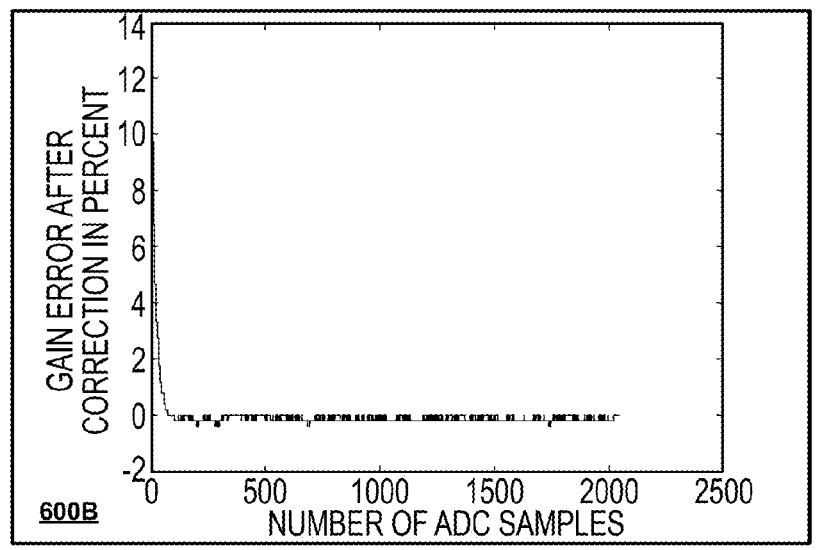
Figure 6C:
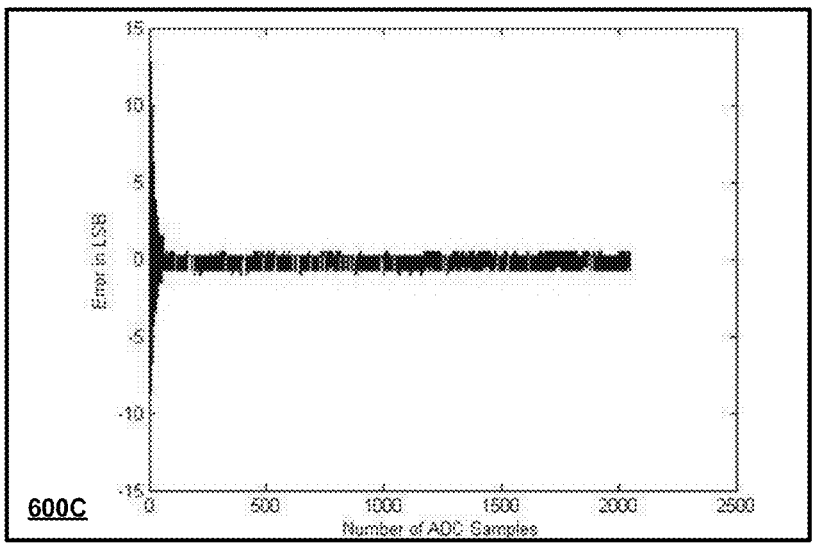

FIGS. 6A through 6C are diagrams illustrating convergence of the examples of offset mismatches, gain mismatches and post-calibration ADC error. Diagram 600A of FIG. 6A shows the offset correction in LSB versus the number of ADC samples. For the example case of diagram 600A, the offset and gain mismatch values prior to calibration are ~2.7 LSBs and ~13%, respectively. The offset correction is converged after approximately 100 cycles (e.g., 100 cycles of a 500 MHz clock which are equivalent to 100×2 ns=200 ns). The post calibration offset mismatch is ~0.25 LSB.

Similarly, diagram 600B of FIG. 6B shows the gain error after correction in percent versus the number of ADC samples. For the example case of diagram 600B, the offset and gain mismatch values prior to calibration are ~2.7 LSBs and ~13%, respectively. However, after convergence of the gain mismatch the gain mismatch is reduced to less than 0.2%.

Diagram 600C of FIG. 6C shows the error relative to the reference sub-ADC of an ADC versus the number of ADC samples. For the example case of diagram 600C, the offset and gain mismatch values prior to calibration are ~2.7 LSBs and ~13%, respectively. After calibration, the error of the ADC under calibration relative to the reference sub-ADC converges to less than 1 LSB error.

FIGS. 7A through 7C are an architectural diagram of an example of a current-mode interleaver 700 and corresponding timing diagrams. The current-mode interleaver 700 includes a voltage-to-current ($G_m$ or transconductance) converter 710, a current-mode interleaver block 720, a current-to-voltage integrator block 730, and sub-ADCs block 740. The voltage-to-current converter block 710 converts the input voltage signal X(t) to a current signal. The current-mode interleaver block 720 includes two stages, a first stage that is a an interleave-by-two stage which generates two interleaved current signals, and a second stage that interleaves each of the two interleaved current signals outputted from the first stage by-two so as to generate four interleaved current signals. The first stage of the current-mode interleaver block 720 includes two switches (e.g., transistors, such as MOS transistors) S11 and S12, which are respectively controlled by the clock signals $\phi_{1-1}$ and $\phi_{1-2}$, which are 180° out of phase. The second stage of the current-mode interleaver block 720 includes four switches S21, S22, S23, and S24, which are respectively controlled by the clock signals $\phi_{2-1}$, $\phi_{2-2}$, $\phi_{2-3}$, and $\phi_{2-4}$.

The four interleaved current signals from the current-mode interleaver block 720 are converted to four interleaved voltage signals in the current-to-voltage integrator block 730, which includes integrators 732. The four voltage signals of the integrators 732 are fed to the sub-ADCs of the sub-ADC block 740. In some aspects, the sub-ADCs are grouped into odd and even numbered sub-ADCs. The sampling time intervals of each sub-ADC are defined by the logical AND of the associated clocks in its signal path. For example, the sampling time interval of the sub-ADC-1 is controlled by the logical AND of the clock signals $\phi_{1-1}$, and $\phi_{1-1}$. It is understood that the current-mode interleaver 700 is not limited to four sub-ADCs and can include higher number of sub-ADCs and a corresponding number of stages in the current-mode interleaver block 720. For example, if the number of sub-ADCs is 128, one realization of the current-mode interleaver block 720 is to include six stages with 2, 4, 8, 16, 32, 64, and 128 interleaving-switches in stages 1 through 6, respectively.

FIG. 7B shows the clock signals $\phi_{1-1}$, $\phi_{1-2}$, $\phi_{2-1}$, $\phi_{2-2}$, $\phi_{2-3}$, and $\phi_{2-4}$, and the sampling intervals of the sub-ADC-1 to sub-ADC-4 marked with numbers 1-4, respectively. The clock signals are 50% duty cycle. As indicated in FIG. 7B, the sampling intervals of each sub-ADC are defined by the logical AND of the clock signals of the switches in its path. For example, the sampling intervals of sub-ADC-3 are shown to be defined by logical AND of $\phi_{1-1}$ and $\phi_{2-2}$.

FIG. 7C shows timing diagrams 750 and 760. In the timing diagram 750, the integration times associated with even (E) and odd (O) samples for the case of ideal clock signals with duty cycle of 50% are shown. The arrows indicate the effective sampling instants of the odd and even samples. When the integration-time window is rectangular (e.g., when all time-instants within the integration interval are equally weighted), the effective sampling instant corresponds to the mid-point of the integration interval. As seen from diagram 750, the integration times associated with even and odd samples are equal and the sampling instants of the odd and even samples are equally spaced. In the timing diagram 760, the integration times associated with even (E) and odd (O) samples for the case of non-ideal clock signals with duty-cycle distortion are shown. Similar to diagram 750, the arrows indicate the effective sampling instants of the odd and even samples. As seen from diagram 760, the integration times associated with even and odd samples are not equal. This results in a systematic gain mismatch between odd and even numbered sub-ADCs. This systematic error can be used to correct the duty cycle of the sampling instances.

An advantage of the current-mode time interleaver of FIG. 7A is the interleaver-clock timing impairment leads to gain mismatch between odd and even sub-ADCs and not to non-uniform sampling-time. The gain mismatch, however, is readily corrected by the gain-adjustment on the odd versus even signal paths, as described above (e.g., using the flow diagrams of FIGS. 3A-3C). In one or more implementations, the gain mismatch can be corrected by adjusting the reference voltages of the sub-ADCs. Referring to FIG. 7A, it is understood that the unequal rise/fall times of the clock signals can potentially result in non-uniform sampling. This undesirable effect, nonetheless, is suppressed by matching the sum of the gain coefficients of the odd and even channels respectively. It is further improved by the high trans-conductance ($G_m$) of the first stage switches (e.g., S11 and S12).

Figure 8B:
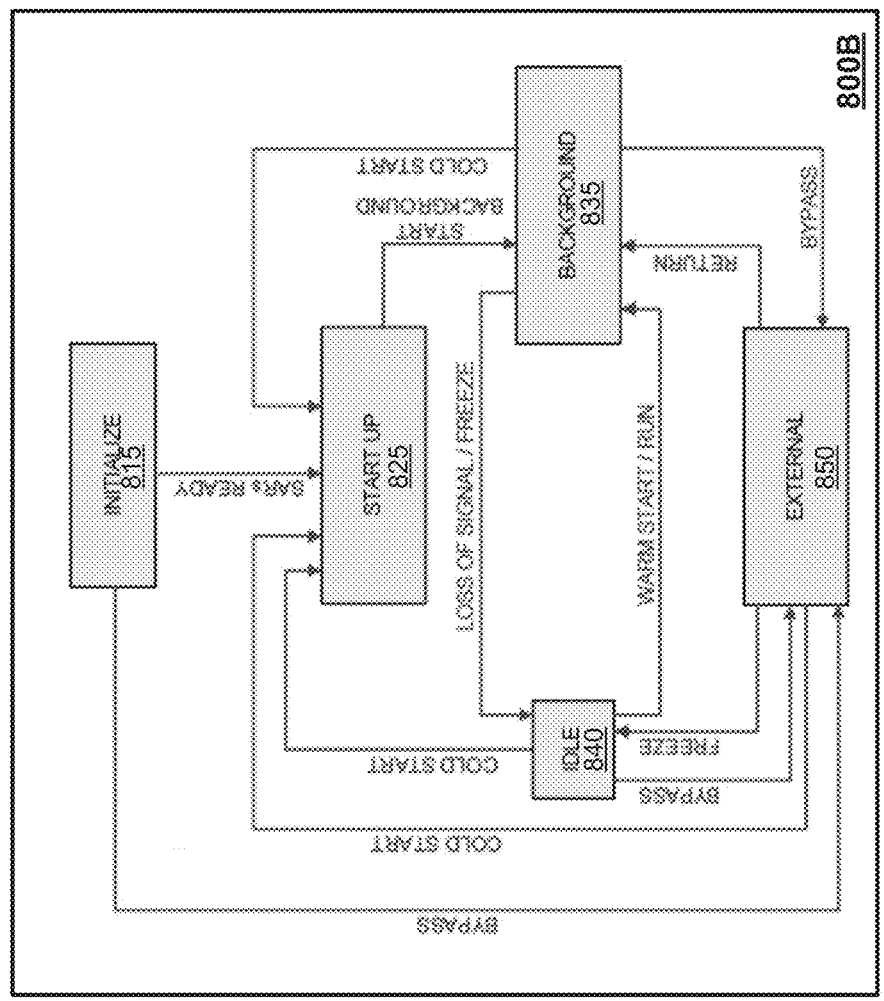
FIGS. 8A and 8B are a high-level architectural diagram of an example of a calibration system and an associated finite-state-machine.
Figure 8A:
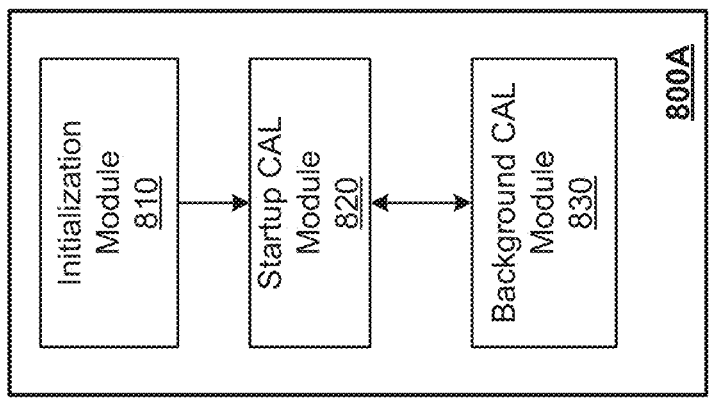

FIGS. 8A and 8B are high-level architectural diagrams of an example of a calibration system 800A and an associated finite-state-machine 800B. The calibration system 800A includes an initialization module 810, a start-up calibration module 820, and a background calibration module 830. The initialization module 810, among other tasks, detects the status of the sub-ADCs after the system (e.g., a chip) is turned on and provides the status to start-up calibration module 820. The startup calibration module 820 performs a startup calibration after the initialization of the chip or following a power-up "cold-start" of the chip. The background calibration module 830 performs the background calibration after the startup calibration and during normal operation of the chip, subsequent to a warm start following an idle state, or in response to an external return command. The startup calibration and the background calibration are bypass-able by external commands received from, for example, an interface or a controller. The command, for instance, may be a freeze command.

The finite-state-machine 800B shows the envisioned calibration states and the transitions between the states. The states of the finite-state-machine 800B include an initialization state 815, a startup state 825, a background state 835, an idle state 840, and an external state 850 that allows a user to intervene and bypass the calibration. The idle state 840 is reached after a freeze resulting from an external freeze command or a loss of signal (e.g., pulling out or removal of a cable). The external state 850 is a state in which the calibration system is under external control. The transitions between states are self-explanatory and include a cold start, a freeze, and a warm start that are described herein. The cold start is when the chip is started from a stopped or frozen state (e.g., resulting from removing a cable) and any previously stored offset correction values may not be applicable. In the warm start, however, the chip is already warm (e.g., running for example in an idle state) and the previously stored offset correction values may be usable.

Figure 9:
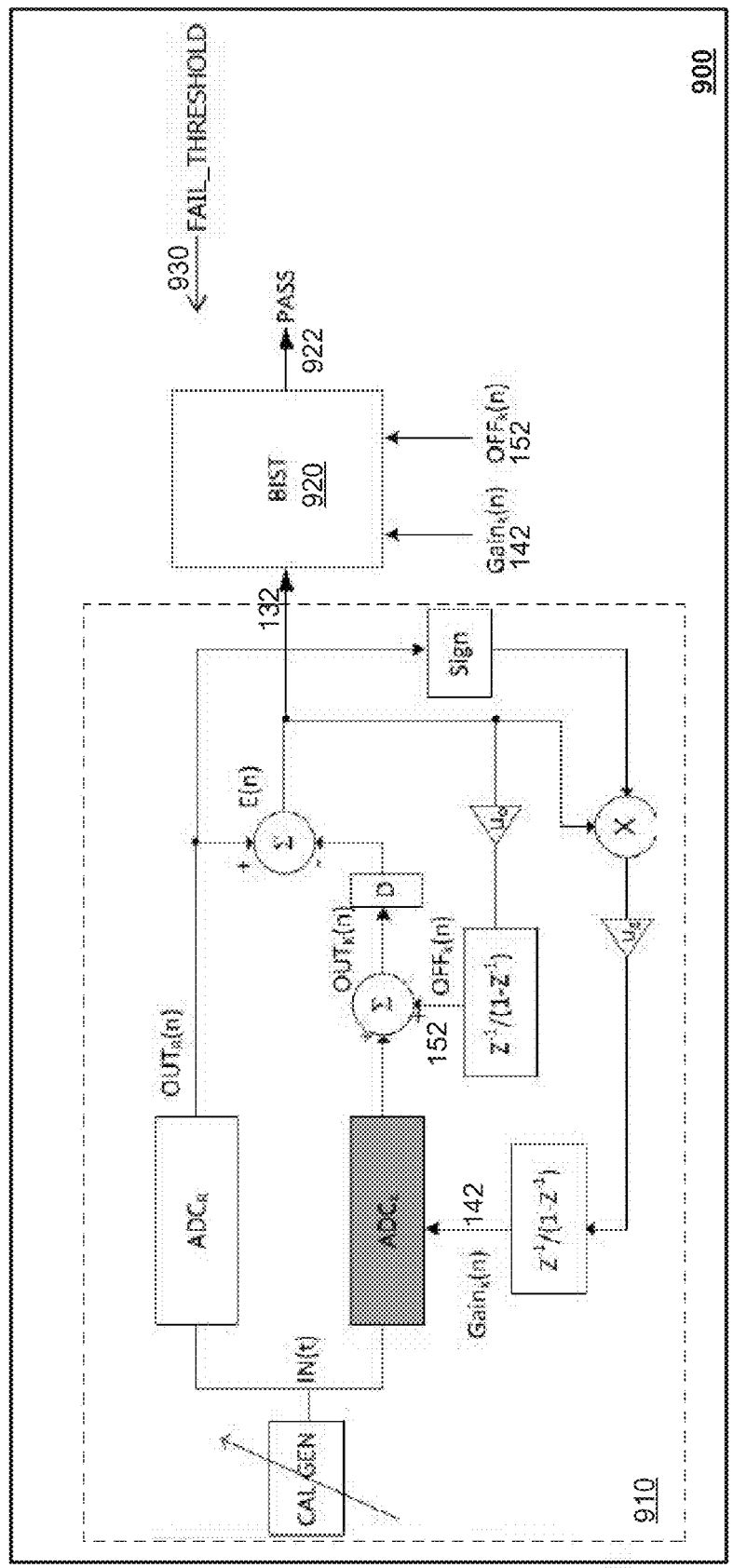
FIG. 9 is an architectural diagram of an example of an apparatus for calibration of an ADC coupled to a built-in-self-test (BIST) circuit.
Figure 10A:
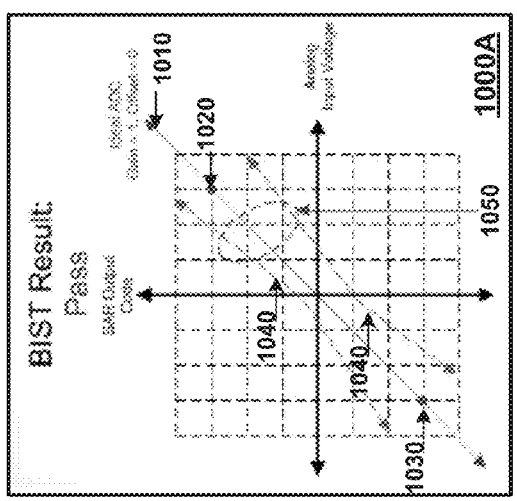
FIGS. 10A through 10F are example results of gross functionality tests of ADCs using the apparatus of FIG. 9.
Figure 10B:
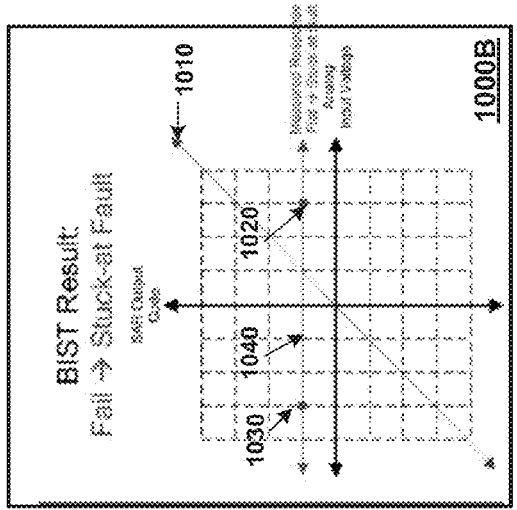
Figure 10C:
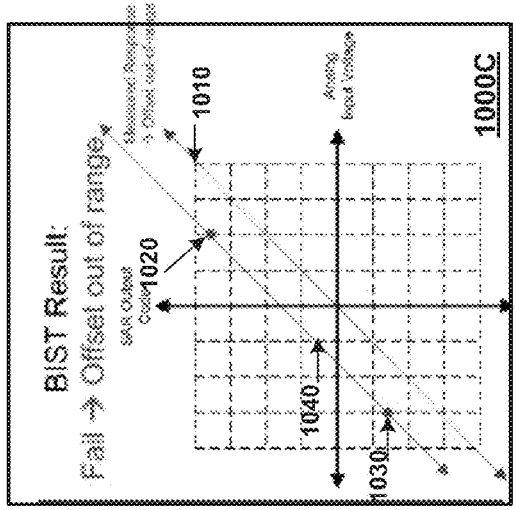
Figure 10D:
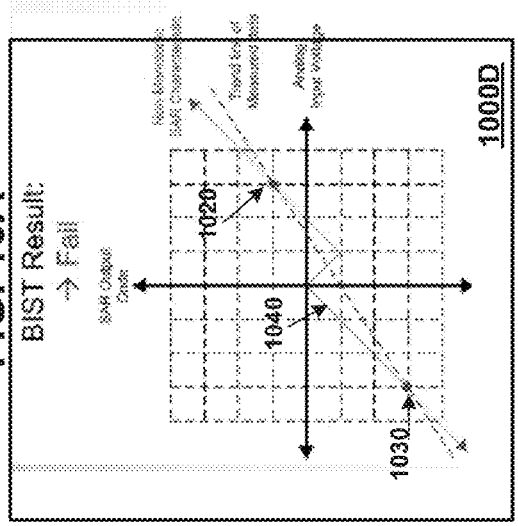
Figure 10E:
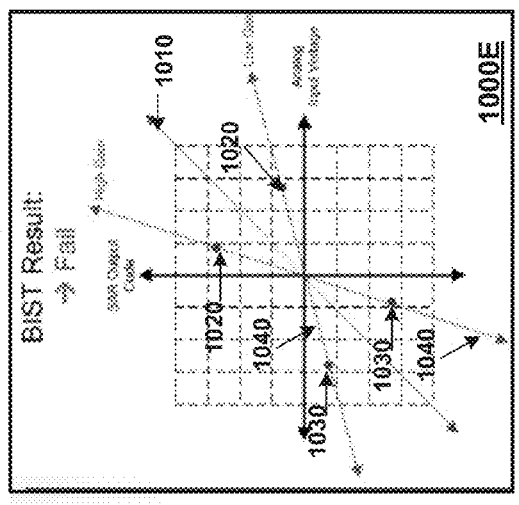
Figure 10F:
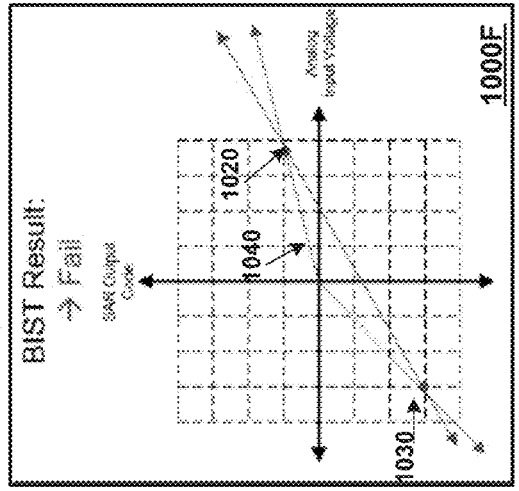

FIG. 9 is an architectural diagram of an example of an apparatus 900 for calibration of an ADC coupled to a built-in-self-test (BIST) circuit 920. The apparatus 900 includes a calibration apparatus 910 and the BIST circuit 920. The calibration apparatus 910 is similar to the above-described apparatus 100 of FIG. 1. The BIST circuit 920 is known and, in the implementation shown in FIG. 9, receives error signal 132 (e.g., E(n)), gain correction signal 142 (e.g., $Gain_K(n)$) and offset correction signal 152 (e.g., $OFF_k(n)$) from the calibration apparatus 910 and generates a pass signal 922. The pass signal 922 may be a logical 0 (e.g., fail) or a logical 1 (e.g., pass). The BIST circuit 920 compares the error signal 132 with a pre-determined fail threshold 930 and fails the ADC if the error signal 132 exceeds the pre-determined fail threshold 930. The BIST circuit 920 can also check to see if the error signal 132 and the gain correction signal 142 are within desired ranges and fail the ADC if they are not within the desired ranges.

It is understood that many ADCs have an integral non-linearity (INL) or differential non-linearity (DNL) characteristics. The INL and DNL characteristics can result from architectural topology, asymmetry in the circuit-layout implementation of the ADC as well as circuit component-mismatches (e.g., FET-mismatches, resistor-mismatches and capacitor mismatches). Gross failure of ADCs can happen as a result of a number of events, for example, particles causing short or open circuits, electrical over-stress (EOS) events, and improper manufacture (e.g., flipped mask or bad reticle). The gain and offset correction loops of the subject technology can detect critical random defects or EOS.

FIGS. 10A through 10F are plots of example results of gross functionality test of ADCs using the apparatus of FIG. 9. In the plots 1000A through 1000F vertical and horizontal axes represent the ADC output code and the analog input voltage values, respectively. The calibration points are shown as 1020 and 1030, the desired ADC (e.g., gain=1, and offset=0) behavior is represented by the line 1010, and the measured response(s) of the ADC is shown as 1040. In the plot 1000A, the measured responses are within an acceptable range (e.g., pass zone) indicated by the circle 1050 and the BIST result is a pass. The plots 1000B through 1000F represent failed ADC situations where the measured responses 1040 drastically deviate from the desired behavior, for example, are stuck-at fail (1000B), are offset out-of range (1000C), are non-monotonic (1000D), or are otherwise unacceptable (1000E and 1000F).

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

Figure 11:
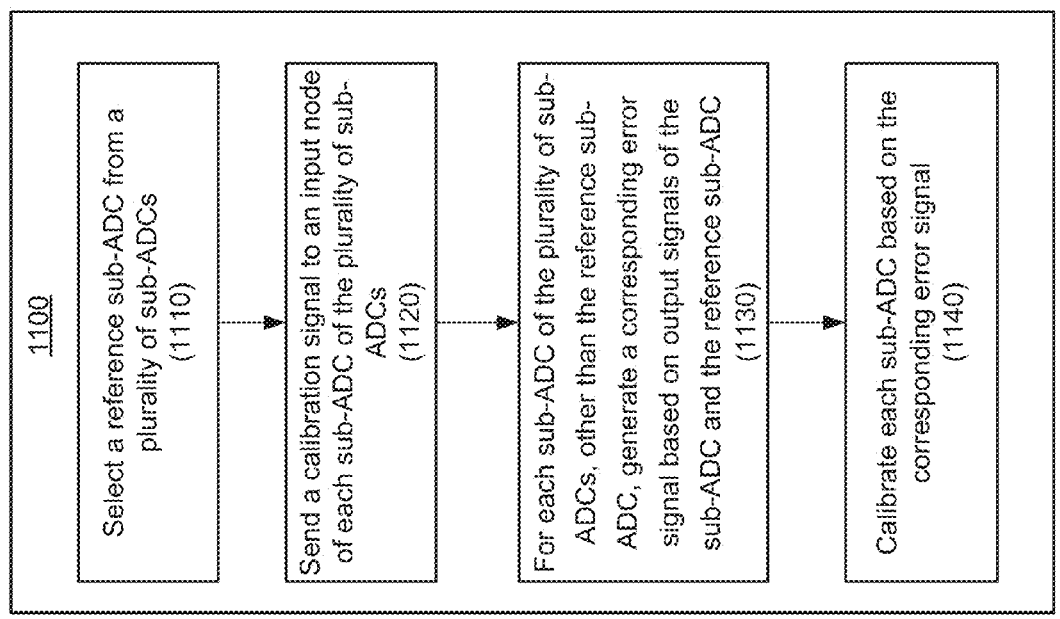
FIG. 11 is a flow diagram illustrating an example of a method for calibration of an ADC.

1. A method (e.g., 1100 of FIG. 11) for calibration of an analog-to-digital converter (ADC), comprising:
    selecting a reference sub-ADC from a plurality of sub-ADCs (e.g., 1110 of FIG. 11);
    sending a calibration signal to an input node of each sub-ADC of the plurality of sub-ADCs (e.g., 1120 of FIG. 11);
    for each sub-ADC of the plurality of sub-ADCs, other than the reference sub-ADC, generating a corresponding error signal based on output signals of the sub-ADC and the reference sub-ADC (e.g., 1130 of FIG. 11); and
    calibrating each sub-ADC based on the corresponding error signal (e.g., 1140 of FIG. 11),
    wherein:
    the ADC comprises a time-interleaved ADC that includes the plurality of sub-ADCs, and
    the reference sub-ADC has a lowest relative offset among the plurality of sub-ADCs.

2. The method of clause 1, wherein:
    when the ADC comprises a single-ended ADC, selecting the reference sub-ADC from the plurality of sub-ADCs comprises measuring an offset of each sub-ADC of the plurality of sub-ADCs while the input node of that sub-ADC is shorted to ground potential,
    when the ADC comprises a differential ADC, selecting the reference sub-ADC from the plurality of sub-ADCs comprises measuring an offset of each sub-ADC of the plurality of sub-ADCs while positive and negative input nodes of the sub-ADC are shorted to each other,
    the relative offset comprises an offset of the sub-ADC relative to a specified target offset value, and
    a relative offset value comprises an absolute value of a difference between the offset of the sub-ADC and the specified target offset value.

3. The method of clause 1), wherein generating the corresponding error signal based on the output signals of that sub-ADC and the reference sub-ADC comprises using a calibration loop that acts to reduce a mean-square difference between the output signals of that sub-ADC and the reference sub-ADC.

4. The method of clause 1, further comprising generating for each sub-ADC a corresponding offset-error signal based on the corresponding error signal,
    wherein:
    generating the corresponding offset-error signal comprises using a first software-controlled parameter and a first accumulator in an offset-calibration loop,
    the offset-calibration loop comprises calibrating each sub-ADC based on the corresponding error signal by adjusting an offset of each sub-ADC at an output node of that sub-ADC in digital domain, and
    adjusting the offset of each sub-ADC at the output node of that sub-ADC comprises generating a new value for the output signal of the sub-ADC by combining the corresponding offset-error signal with a previous value of the output signal of the sub-ADC.

5. The method of clause 4, further comprising automatically detecting a convergence of the offset-calibration loop, comprising:
    allowing the offset-calibration loop to run for N-WAIT cycles before starting to check if the offset-calibration loop has converged, wherein N-WAIT is programmable, wherein N-WAIT is an integer greater than zero;
    determining that the convergence of the offset-calibration loop is reached when an absolute offset-correction and a cycle-to-cycle change in offset-correction are within predetermined tolerances; and
    when the convergence of the offset-calibration loop is not reached, allowing the offset-calibration loop to run for up to a maximum N-MAX-ITER more cycles until the convergence of the offset-calibration loop is reached or non-convergence is detected as a BIST failure, wherein N-MAX-ITER is programmable, wherein N-MAX-ITER comprises an integer greater than zero.

6. The method of clause 1, further comprising generating for each sub-ADC a corresponding gain-error signal based on the corresponding error signal in a gain-calibration loop,
    wherein:
    the gain-calibration loop comprises calibrating each sub-ADC based on the corresponding error signal by adjusting a corresponding reference voltage of each sub-ADC,
    adjusting the corresponding reference voltage of each sub-ADC comprises modifying an input digital code to a corresponding gain-adjustment digital-to-analog converter (DAC) that generates the corresponding reference voltage of each sub-ADC,
    modifying the input digital code to the corresponding gain-adjustment DAC is based on the corresponding gain-error signal, and
    generating the corresponding gain-error signal comprises taking a product of three terms comprising the corresponding error signal, a sign of the output signal of the reference sub-ADC, a software-controlled parameter, and accumulating the product in a second accumulator,
    storing a corresponding gain-correction including the modified input digital code in gain-adjustment DACs for later retrieval,
    automatically detecting a convergence of the gain-calibration loop.

7. The method of clause 6, further comprising automatically detecting a convergence of the gain-calibration loop, comprising:
    allowing the gain-calibration loop to run for N-WAIT cycles before starting to check whether the gain-calibration loop has converged, wherein N-WAIT is programmable, wherein N-WAIT is an integer greater than zero;
    determining that the convergence of the gain-calibration loop is reached when an absolute gain-correction and a cycle-to-cycle change in gain-correction are within predetermined tolerances; and
    when the convergence of the gain-calibration loop is not reached, allowing the gain-calibration loop to run for up to a maximum N-MAX-ITER more cycles until the convergence of the gain-calibration loop is reached or non-convergence is detected as a BIST failure, wherein N-MAX-ITER is programmable, wherein N-MAX-ITER is an integer greater than zero.

8. The method of clause 7, further comprising detecting functionality faults of the ADC by:
    applying the corresponding error signal, the corresponding offset-error signal, and the corresponding gain-error signal to a built-in self-test (BIST) circuit;
    performing a startup calibration; and
    receiving failure reports from the BIST circuit, when the gain-calibration loop or the offset-calibration loop fails to converge or a gross ADC mismatch is detected by the BIST circuit.

9. The method of clause 8, wherein performing the startup calibration is done after an initialization of a chip or following a cold start of the chip, and wherein the BIST circuit reports the gross ADC mismatch when the corresponding error signal is larger than a predetermined fail-threshold provided to the BIST circuit.

10. The method of clause 8, wherein the functionality faults include nonlinearity, critical random errors, and electronic over-stress (EOS) faults, and wherein detecting functionality faults of the ADC is performed without adversely affecting functionalities of the ADC.

11. The method of clause 1, further comprising an ADC-to-ADC calibration, comprising:
determining that an offset-calibration loop and a gain-calibration loop of the ADC are converged; and
in response to the determination that offset-calibration loop and a gain-calibration loop of the ADC are converged, using a value of the relative offset associated with the reference sub-ADC as an offset value for another ADC.

12. The method of clause 1, wherein:
the calibration signal comprises two distinct values,
the calibration signal comprises white Gaussian Noise,
the calibration signal comprises a square wave with added white Gaussian Noise, and
an amplitude of the calibration signal is adjustable.

13. The method of clause 1, further comprising determining a proper amplitude for the calibration signal, wherein determining the proper amplitude for the calibration signal comprises:
applying the calibration signal with an initial amplitude value to the reference sub-ADC, wherein the initial amplitude value comprises a highest value; and
successively decrementing in a loop the possible subsequent amplitude values of the calibration signal to reach the proper amplitude for the calibration signal, for which the output signal of the reference sub-ADC is no longer clipped.

14. The method of clause 1, wherein:
the calibration of the ADC comprises a startup calibration and a background calibration,
the startup calibration is performed after an initialization of a chip or following a cold start of the chip,
the background calibration is performed after the startup calibration and during normal operation of the chip, subsequent to a warm start following an idle state, or in response to an external return command,
the startup calibration and the background calibration are bypass-able by external commands, and
the idle state is reached after a freeze resulting from an external freeze command or a loss of signal.

Figure 13:
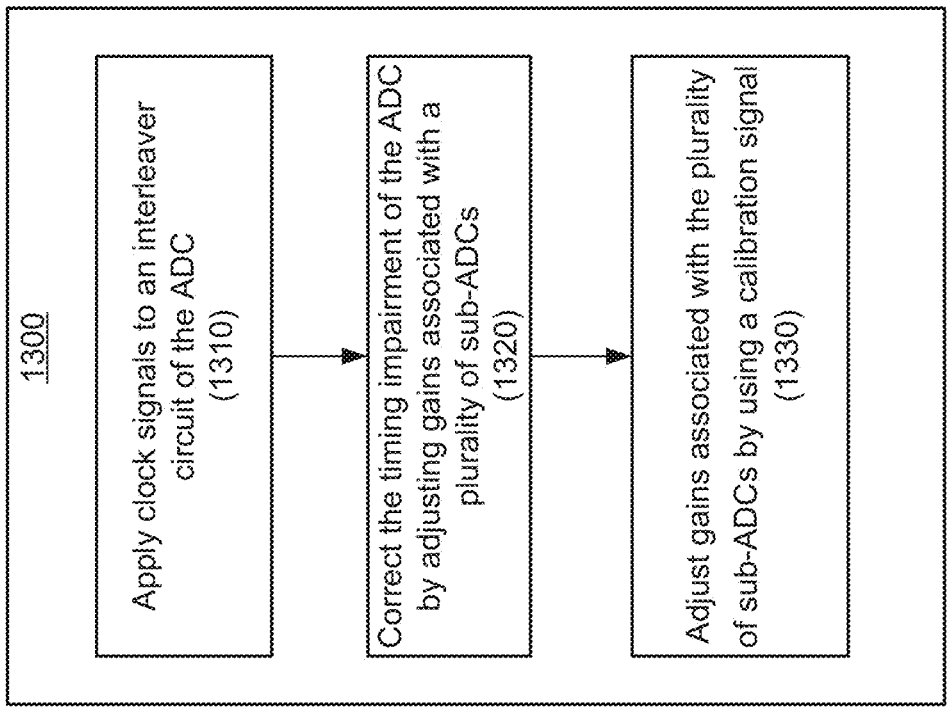
FIG. 13 is a flow diagram illustrating an example of a method for correction of a timing impairment of an ADC.

15. A method (e.g., 1300 of FIG. 13) for correction of a timing impairment of an analog-to-digital converter (ADC), comprising:
applying clock signals to an interleaver circuit of the ADC (e.g., 1310 of FIG. 13); and
correcting the timing impairment of the ADC by adjusting gains associated with a plurality of sub-ADCs (e.g., 1320 of FIG. 13),
wherein:
the ADC comprises a time-interleaved ADC,
the plurality of sub-ADCs include even sub-ADCs and odd sub-ADCs,
adjusting gains associated with the plurality of sub-ADCs is performed by using a calibration signal (e.g., 1330 of FIG. 13),
the timing impairment of the ADC is based on timing distortion associated with the clock signals, and results in gain mismatch between the plurality of sub-ADCs,
the ADC comprises an interleaver circuit that receives the clock signals and generates current signals, and
the current signals are integrated and delivered to the plurality of sub-ADCs.

16. The method of clause 15, wherein adjusting gains associated with the plurality of sub-ADCs comprises using different gain adjustments for the even sub-ADCs and odd sub-ADCs, and wherein adjusting gains associated with the plurality of sub-ADCs comprises:
selecting a reference sub-ADC from the plurality of sub-ADCs;
sending a calibration signal to an input node of each sub-ADC of the plurality of sub-ADCs;
for each sub-ADC of the plurality of sub-ADCs, other than the reference sub-ADC, generating a corresponding error signal based on output signals of the sub-ADC and the reference sub-ADC; and
calibrating each sub-ADC based on the corresponding error signal,
wherein the reference sub-ADC has a lowest relative offset among the plurality of sub-ADCs.

17. The method of clause 16, wherein:
when the ADC comprises a single-ended ADC, selecting the reference sub-ADC from the plurality of sub-ADCs comprises measuring an offset of each sub-ADC of the plurality of sub-ADCs while the input node of that sub-ADC is shorted to ground potential,
when the ADC comprises a differential ADC, selecting the reference sub-ADC from the plurality of sub-ADCs comprises measuring an offset of each sub-ADC of the plurality of sub-ADCs while shorting to each other positive and negative inputs of the sub-ADC.
the relative offset comprises an offset of the sub-ADC relative to a specified target offset value, and
a value of the relative offset is an absolute value of a difference between the offset of the sub-ADC and the specified target offset value.

18. The method of clause 17, wherein generating the corresponding error signal based on the output signals of that sub-ADC and the reference sub-ADC comprises using a calibration loop that acts to reduce a mean-square difference between the output signals of that sub-ADC and the reference sub-ADC.

19. The method of clause 16, further comprising generating for each sub-ADC a corresponding gain-error signal based on the corresponding error signal in a gain-calibration loop,
wherein:
the gain-calibration loop comprises calibrating each sub-ADC based on the corresponding error signal by adjusting a corresponding reference voltage of each sub-ADC,
adjusting the corresponding reference voltage of each sub-ADC comprises modifying an input digital code to a corresponding gain-adjustment digital-to-analog converter (DAC) that generates the reference voltage of each sub-ADC,
modifying the input digital code to the corresponding gain-adjustment DAC is based on the corresponding gain-error signal,
generating the corresponding gain-error signal comprises taking a product of three terms comprising the corresponding error signal, a sign of the output signal of the reference sub-ADC, and a software-controlled parameter, and accumulating the product in a second accumulator,
storing a corresponding gain-correction including the modified input digital code to gain-adjustment DACs for later retrieval, and
automatically detecting a convergence of the gain-calibration loop.

Figure 15:
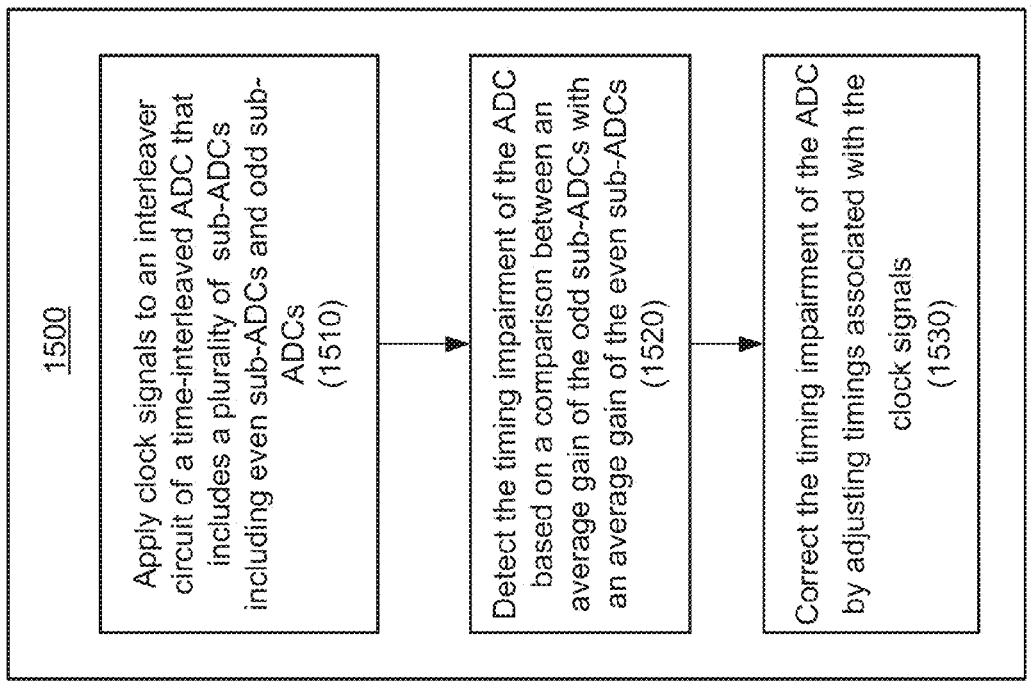
FIG. 15 is a flow diagram illustrating an example of a method for correction of a timing impairment of an ADC.

20. A method (e.g., 1500 of FIG. 15) for correction of a timing impairment of an analog-to-digital converter (ADC), comprising:
applying clock signals to an interleaver circuit of the ADC, wherein the ADC comprises a time-interleaved ADC comprising a plurality of sub-ADCs including even sub-ADCs and odd sub-ADCs (e.g., 1510 of FIG. 15);

detecting the timing impairment of the ADC based on a comparison between an average gain of the odd sub-ADCs with an average gain of the even sub-ADCs (e.g., 1520 of FIG. 15); and correcting the timing impairment of the ADC by adjusting timings associated with the clock signals (e.g., 1530 of FIG. 15), wherein:

the timing impairment of the ADC is due to timing distortions associated with the clock signals, and results in gain mismatch between the even sub-ADCs and odd sub-ADCs, the ADC comprises an interleaver circuit that receives the clock signals and generates current signals, and the current signals are integrated and delivered to the plurality of sub-ADCs.

21. An apparatus (e.g., 100 of FIG. 1) for calibration of an analog-to-digital converter (ADC) including a plurality of sub-ADCs (e.g., 120 of FIG. 1), comprising:

a reference sub-ADC (e.g., 110 of FIG. 1) among the plurality of sub-ADCs;

a calibration-signal generator (e.g., 105 of FIG. 1) configured to provide a calibration signal (e.g., 108 of FIG. 1) at an input node of each sub-ADC of the plurality of sub-ADCs; and a gain-correction path (e.g., 160 of FIG. 1) configured to generate, for each sub-ADC of the plurality of sub-ADCs, other than the reference sub-ADC, a corresponding error signal (e.g., 168 of FIG. 1) based on output signals of the sub-ADC (e.g., 122 of FIG. 1) and the reference sub-ADC (e.g., 112 of FIG. 1), wherein each sub-ADC is configured to be calibrated based on the corresponding error signal, the ADC comprises a time-interleaved ADC that includes the plurality of sub-ADCs, and the reference sub-ADC is configured to have a lowest relative offset among the plurality of sub-ADCs.

22. The apparatus of clause 21, wherein:

the apparatus is configured to allow the reference sub-ADC to be selected from the plurality of sub-ADCs based on measuring an offset of each sub-ADC, when the ADC comprises a single-ended ADC, selecting the reference sub-ADC from the plurality of sub-ADCs comprises measuring an offset of each sub-ADC of the plurality of sub-ADCs while the input node of that sub-ADC is shorted to ground potential, when the ADC comprises a differential ADC, selecting the reference sub-ADC from the plurality of sub-ADCs comprises measuring an offset of each sub-ADC of the plurality of sub-ADCs while shorting to each other positive and negative inputs of the sub-ADC, the relative offset comprises an offset of the sub-ADC relative to a specified target offset value, and a value of the relative offset is an absolute value of the difference between the offset the sub-ADC and the specified target offset value.

23. The apparatus of clause 22, wherein the gain-correction path is configured to act to reduce a mean-square difference between the output signals of that sub-ADC and the reference sub-ADC.

24. The apparatus of clause 21, further comprising an offset-correction path configured to generate, for each sub-ADC, a corresponding offset-error signal based on the corresponding error signal, wherein:

the offset-correction path comprises a first accumulator and is configured to generate the corresponding offset-error signal based on using a first software-controlled parameter and the first accumulator, the offset-correction path is configured to calibrate each sub-ADC based on the corresponding error signal by adjusting an offset of each sub-ADC at an output node of that sub-ADC in digital domain, and the offset-correction path is configured to adjust the offset of each sub-ADC at the output node of that sub-ADC by generating a new value for the output signal of the sub-ADC by combining the corresponding offset-error signal with a previous value of the output signal of the sub-ADC.

25. The apparatus of clause 24, further comprising an offset error monitor configured to automatically detect a convergence of the offset-correction path, by:

allowing the offset-calibration loop to run for N-WAIT cycles before starting to check if the offset-calibration loop has converged, wherein N-WAIT is programmable, wherein N-WAIT comprises an integer greater than zero;

determining that the convergence of the offset-calibration loop is reached when an absolute offset-correction and a cycle-to-cycle change in offset-correction are within predetermined tolerances; and when the convergence of the offset-calibration loop is not reached, allowing the offset-calibration loop to run for up to a maximum N-MAX-ITER more cycles until the convergence of the offset-calibration loop is reached or non-convergence is detected as a BIST failure, wherein N-MAX-ITER is programmable, wherein N-MAX-ITER comprises an integer greater than zero.

26. The apparatus of clause 21, wherein:

the gain-correction path is configured to calibrate each sub-ADC based on the corresponding error signal by adjusting a corresponding reference voltage of each sub-ADC, the gain-correction path is configured to adjust the corresponding reference voltage of each sub-ADC by modifying an input digital code to a corresponding gain-adjustment digital-to-analog converter (DAC) that generates the reference voltage of each sub-ADC, the gain-correction path is configured to modify the input digital code to the corresponding gain-adjustment DAC based on the corresponding gain-error signal, the gain-correction path is configured to generate the corresponding gain-error signal by using a product of three terms comprising the corresponding error signal, a sign of the output signal of the reference sub-ADC, and a software-controlled parameter, and accumulating the product in a second accumulator, and the apparatus further comprises:

gain-correction registers configured to store a corresponding gain-correction including the modified input digital code to gain-adjustment DACs for later retrieval, and a gain error monitor configured to automatically detect a convergence of the gain-correction path.

27. The apparatus of clause 26, wherein the gain error monitor is configured to:

allow the gain-correction path to run for N-WAIT cycles before starting to check if the gain-calibration loop has converged, wherein N-WAIT is programmable, wherein N-WAIT comprises an integer greater than zero;

determine that the convergence of the gain-calibration loop is reached when an absolute gain-correction and a cycle-to-cycle change in gain-correction are within predetermined tolerances; and when the convergence of the gain-calibration loop is not reached, allow the gain-calibration loop to run for up to a maximum N-MAX-ITER more cycles until the convergence of the gain-calibration loop is reached or non-convergence is detected as a BIST failure, wherein N-MAX-ITER is programmable, wherein N-MAX-ITER comprises an integer greater than zero.

28. The apparatus of clause 27, the gain-error monitor is further configured to detect functionality faults of the ADC by:
applying the corresponding error signal, the corresponding offset-error signal, and the corresponding gain-error signal to a built-in self-test (BIST) circuit;
performing a startup calibration;
receiving failure reports from the BIST circuit, when the gain-correction path or the offset-correction path fails to converge or a gross ADC mismatch is detected by the BIST circuit.

29. The apparatus of clause 28, wherein the gain error monitor is configured to perform the startup calibration after an initialization of a chip or following a cold start of the chip, and wherein the BIST circuit is configured to report the gross ADC mismatch when the corresponding error signal is larger than a predetermined fail-threshold provided to the BIST circuit.

30. The apparatus of clause 28, wherein the functionality faults include nonlinearity, critical random errors, and electronic over-stress (EOS) faults, and wherein the gain-error monitor is configured to detect the functionality faults of the ADC without adversely affecting functionalities of the ADC.

31. The apparatus of clause 21, further comprising an ADC-to-ADC calibration module configured to:
determine that an offset-correction path and a gain-correction path of the ADC are converged; and
in response to the determination that offset-correction path and a gain-correction path of the ADC are converged, use a value of the relative offset associated with the reference sub-ADC as an offset value for another ADC, wherein each of the ADC and the other ADC are implemented by time-interleaving a plurality of sub-ADCs.

32. The apparatus of clause 21, wherein the calibration-signal generator is configured to generate the calibration signal that comprises:
distinct values,
a square wave with added white Gaussian Noise, and
an adjustable amplitude.

33. The apparatus of clause 21, wherein the gain-correction path is configured to determine an amplitude for the calibration signal by:
applying the calibration signal with an initial amplitude value to the reference sub-ADC, wherein the initial amplitude value comprises a highest value; and
successively decrementing in a loop the possible subsequent amplitude values of the calibration signal to reach the amplitude for the calibration signal, for which the output signal of the reference sub-ADC is no longer clipped.

34. The apparatus of clause 21, further comprising a startup calibration module and a background calibration module, wherein:
the startup calibration module is configured to perform a startup calibration after an initialization of a chip or following a cold start of the chip,
the background calibration module is configured to perform the background calibration after the startup calibration and during normal operation of the chip, subsequent to a warm start following an idle state, or in response to an external return command,
the startup calibration and the background calibration are bypass-able by external commands, and
the idle state is reached after a freeze resulting from an external freeze command or a loss of signal.

35. An apparatus (e.g., 700 of FIG. 7A) for correction of a timing impairment of a time-interleaved analog-to-digital converter (ADC), comprising:
an interleaver circuit (e.g., 720 of FIG. 7A) coupled to a plurality of sub-ADCs (e.g., sub-ADC-1 to sub-ADC-4 of FIG. 7A) of the ADC and configured to receive clock signals and generate a plurality of current signals;
a plurality of integrators (e.g., 732 of FIG. 7A) configured to convert the plurality of current signals to a plurality of voltage signals that are applied to the plurality of sub-ADCs; and
a gain-correction path (e.g., 160 of FIG. 1) configured to correct the timing impairment of the ADC based on using a calibration signal to adjust gains associated with the plurality of sub-ADCs,
wherein:
the timing impairment of the ADC is based on timing distortion associated with the clock signal and results in gain mismatch between the plurality of sub-ADCs, and
adjusting gains associated with the plurality of sub-ADCs compensates for gain mismatches between the plurality of sub-ADCs.

36. The apparatus of clause 35, wherein the gain correction path is configured to adjust gains associated with the plurality of sub-ADCs by using different gain adjustments for the even sub-ADCs and odd sub-ADCs, and wherein the gain-correction path is configured to adjust gains associated with the plurality of sub-ADCs by:
selecting a reference sub-ADC from the plurality of sub-ADCs;
sending a calibration signal to an input node of each sub-ADC of the plurality of sub-ADCs; and
for each sub-ADC of the plurality of sub-ADCs, other than the reference sub-ADC, generating a corresponding error signal based on output signals of the sub-ADC and the reference sub-ADC, and
wherein:
the gain-correction path is configured to calibrate each sub-ADC based on the corresponding error signal, and
the reference sub-ADC has a lowest relative offset among the plurality of sub-ADCs.

37. The apparatus of clause 36, wherein:
the gain-correction path is configured to select the reference sub-ADC from the plurality of sub-ADCs by measuring the offset of each sub-ADC of the plurality of sub-ADCs,
when the ADC comprises a single-ended ADC, the gain-correction path is configured to select the reference sub-ADC from the plurality of sub-ADCs by measuring an offset of each sub-ADC of the plurality of sub-ADCs while the input node of that sub-ADC is shorted to ground potential,
when the ADC comprises a differential ADC, the gain-correction path is configured to select the reference sub-ADC from the plurality of sub-ADCs by measuring an offset of each sub-ADC of the plurality of sub-ADCs while shorting to each other positive and negative inputs of the sub-ADC,
the relative offset comprises an offset of the sub-ADC relative to a specified target offset value, and
a value of the relative offset comprises an absolute value of a difference between the offset of the sub-ADC and the specified target offset value.

38. The apparatus of clause 37, wherein the gain-correction path is configured to act to reduce a mean-square difference between the output signals of that sub-ADC and the reference sub-ADC.

39. The apparatus of clause 36, wherein the gain-correction path is configured to:

generate, for each sub-ADC, a corresponding gain-error signal based on the corresponding error signal;

calibrate each sub-ADC based on the corresponding error signal by adjusting a corresponding reference voltage of each sub-ADC;

adjust the corresponding reference voltage of each sub-ADC by modifying an input digital code to a corresponding gain-adjustment digital-to-analog converter (DAC) that generates the reference voltage of each sub-ADC;

modify the input digital code to the corresponding gain-adjustment DAC based on the corresponding gain-error signal;

generate the corresponding gain-error signal by using a product of three terms comprising the corresponding error signal, a sign of the output signal of the reference sub-ADC, and a software-controlled parameter and then accumulating the product in a second accumulator; and store a corresponding gain-correction including the modified input digital code to gain-adjustment DACs for later retrieval, and wherein the apparatus further comprises a gain error monitor configured to automatically detect a convergence of the gain-correction path.

40. An apparatus (e.g., 700 of FIG. 7A) for correction of a timing impairment of a time-interleaved analog-to-digital converter (ADC), comprising:

an interleaver circuit (e.g., 720 of FIG. 7A) coupled to a plurality of odd and even sub-ADCs (e.g., sub-ADC-1 to sub-ADC-4 of FIG. 7A) of the ADC and configured to receive clock signals and generate a plurality of current signals;

a plurality of integrators (e.g., 732 of FIG. 7A) configured to convert the plurality of current signals to a plurality of voltage signals that are applied to the plurality of sub-ADCs; and a comparator configured to determine timing impairment of the ADC based on a comparison between an average gain of the odd sub-ADCs with an average gain of the even sub-ADCs, wherein:

the timing impairment of the ADC is based on timing distortions associated with the clock signals, and results in gain mismatch between the even sub-ADCs and odd sub-ADCs, and the timing impairment of the ADC is correctable based on adjusting timings associated with the clock signals.

41. A hardware apparatus comprising circuits (e.g., 100 of FIG. 1 or 700 of FIG. 7A) configured to perform one or more methods or operations of any one of clauses 1-20 or any other clauses.

Figure 12:
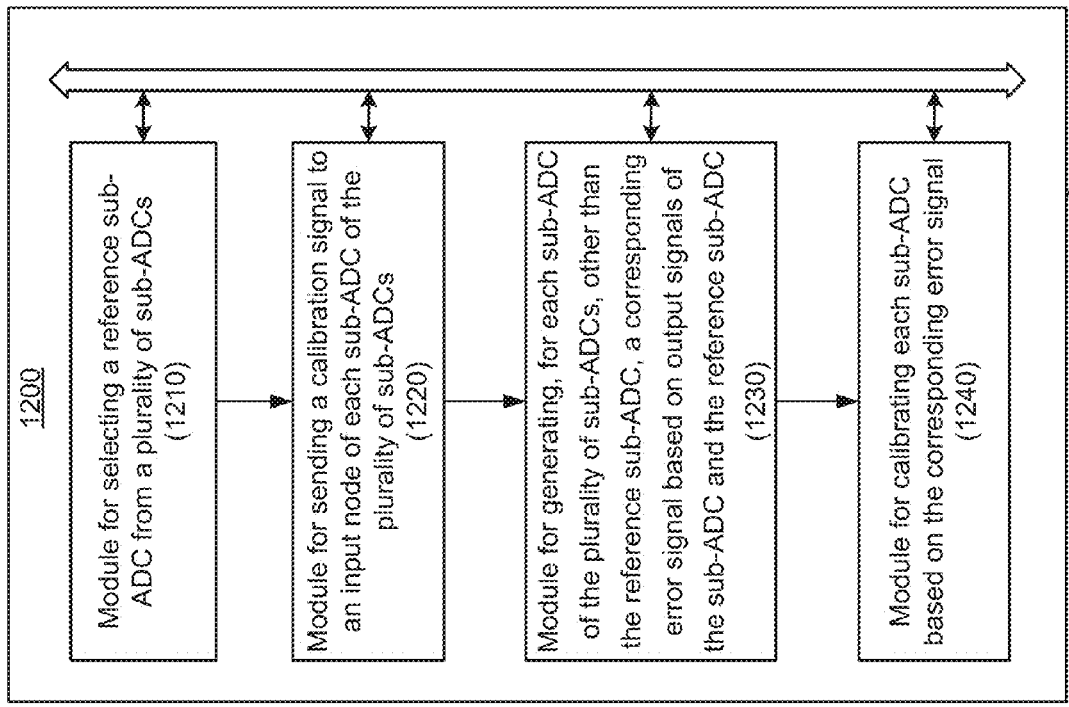
FIG. 12 is diagram illustrating an example of an apparatus including modules for calibration of an ADC.
Figure 14:
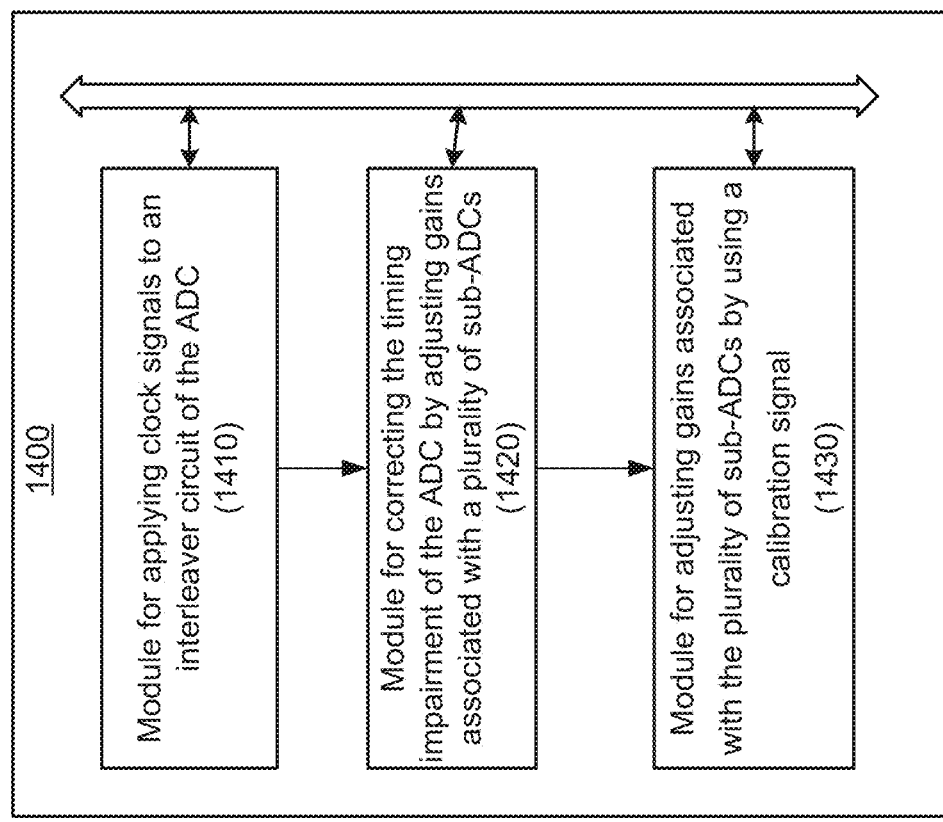
FIG. 14 is diagram illustrating an example of an apparatus including modules for correction of a timing impairment of an ADC.
Figure 16:
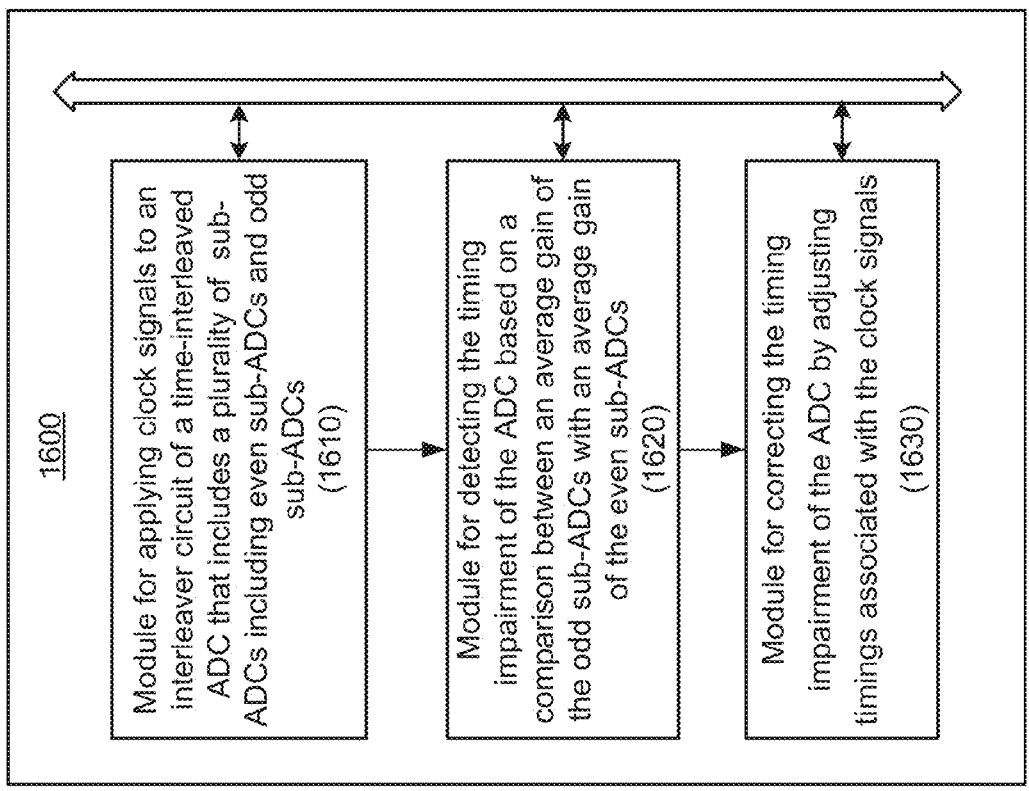
FIG. 16 is diagram illustrating an example of an apparatus including modules for correction of a timing impairment of an ADC.

42. An apparatus comprising means (e.g., of Apparatus 1200, 1400, and 1600 of FIGS. 12, 14, and 16) adapted for performing one or more methods or operations of any one of clauses 1-20 or any other clauses.

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals or differential current signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

The invention claimed is:

1. An apparatus for calibration of an analog-to-digital converter (ADC) including a plurality of sub-ADCs comprising:

a reference sub-ADC among the plurality of sub-ADCs;
a calibration-signal generator configured to provide a calibration signal at an input node of each sub-ADC of the plurality of sub-ADCs; and
a gain-correction path configured to generate, for each sub-ADC of the plurality of sub-ADCs, other than the reference sub-ADC, a corresponding error signal based on output signals of the sub-ADC and the reference sub-ADC, wherein
each sub-ADC is configured to be calibrated based on the corresponding error signal,
the ADC comprises a time-interleaved ADC that includes the plurality of sub-ADCs, and
the reference sub-ADC is configured to have a lowest relative offset among the plurality of sub-ADCs.

2. The apparatus of claim 1, wherein:
the apparatus is configured to allow the reference sub-ADC to be selected from the plurality of sub-ADCs based on measuring an offset of each sub-ADC,
when the ADC comprises a single-ended ADC, selecting the reference sub-ADC from the plurality of sub-ADCs comprises measuring an offset of each sub-ADC of the plurality of sub-ADCs while the input node of that sub-ADC is shorted to ground potential,
when the ADC comprises a differential ADC, selecting the reference sub-ADC from the plurality of sub-ADCs comprises measuring an offset of each sub-ADC of the plurality of sub-ADCs while shorting to each other positive and negative inputs of the sub-ADC,
the relative offset comprises an offset of the sub-ADC relative to a specified target offset value, and
a value of the relative offset is an absolute value of the difference between the offset the sub-ADC and the specified target offset value.

3. The apparatus of claim 2, wherein the gain-correction path is configured to act to reduce a mean-square difference between the output signals of that sub-ADC and the reference sub-ADC.

4. The apparatus of claim 1, further comprising an offset-correction path configured to generate, for each sub-ADC, a corresponding offset-error signal based on the corresponding error signal,
wherein:
the offset-correction path comprises a first accumulator and is configured to generate the corresponding offset-error signal based on using a first software-controlled parameter and the first accumulator,
the offset-correction path is configured to calibrate each sub-ADC based on the corresponding error signal by adjusting an offset of each sub-ADC at an output node of that sub-ADC in digital domain, and
the offset-correction path is configured to adjust the offset of each sub-ADC at the output node of that sub-ADC by generating a new value for the output signal of the sub-ADC by combining the corresponding offset-error signal with a previous value of the output signal of the sub-ADC.

5. The apparatus of claim 4, further comprising an offset error monitor configured to automatically detect a convergence of the offset-correction path, by:
allowing the offset-calibration loop to run for N-WAIT cycles before starting to check if the offset-calibration loop has converged, wherein N-WAIT is programmable, wherein N-WAIT comprises an integer greater than zero;
determining that the convergence of the offset-calibration loop is reached when an absolute offset-correction and a cycle-to-cycle change in offset-correction are within predetermined tolerances; and
when the convergence of the offset-calibration loop is not reached, allowing the offset-calibration loop to run for up to a maximum N-MAX-ITER more cycles until the convergence of the offset-calibration loop is reached or non-convergence is detected as a BIST failure, wherein N-MAX-ITER is programmable, wherein N-MAX-ITER comprises an integer greater than zero.

6. The apparatus of claim 1, wherein:
the gain-correction path is configured to calibrate each sub-ADC based on the corresponding error signal by adjusting a corresponding reference voltage of each sub-ADC,
the gain-correction path is configured to adjust the corresponding reference voltage of each sub-ADC by modifying an input digital code to a corresponding gain-adjustment digital-to-analog converter (DAC) that generates the reference voltage of each sub-ADC,
the gain-correction path is configured to modify the input digital code to the corresponding gain-adjustment DAC based on the corresponding gain-error signal,
the gain-correction path is configured to generate the corresponding gain-error signal by using a product of three terms comprising the corresponding error signal, a sign of the output signal of the reference sub-ADC, and a software-controlled parameter, and accumulating the product in a second accumulator, and
the apparatus further comprises:
gain-correction registers configured to store a corresponding gain-correction including the modified input digital code to gain-adjustment DACs for later retrieval, and
a gain error monitor configured to automatically detect a convergence of the gain-correction path.

7. The apparatus of claim 6, wherein the gain error monitor is configured to:
allow the gain-correction path to run for N-WAIT cycles before starting to check if the gain-calibration loop has converged, wherein N-WAIT is programmable, wherein N-WAIT comprises an integer greater than zero;
determine that the convergence of the gain-calibration loop is reached when an absolute gain-correction and a cycle-to-cycle change in gain-correction are within predetermined tolerances; and
when the convergence of the gain-calibration loop is not reached, allow the gain-calibration loop to run for up to a maximum N-MAX-ITER more cycles until the convergence of the gain-calibration loop is reached or non-convergence is detected as a BIST failure, wherein N-MAX-ITER is programmable, wherein N-MAX-ITER comprises an integer greater than zero.

8. The apparatus of claim 7, the gain-error monitor is further configured to detect functionality faults of the ADC by:
applying the corresponding error signal, the corresponding offset-error signal, and the corresponding gain-error signal to a built-in self-test (BIST) circuit;
performing a startup calibration;
receiving failure reports from the BIST circuit, when the gain-correction path or the offset-correction path fails to converge or a gross ADC mismatch is detected by the BIST circuit.

9. The apparatus of claim 8, wherein the gain error monitor is configured to perform the startup calibration after an initialization of a chip or following a cold start of the chip, and wherein the BIST circuit is configured to report the gross ADC mismatch when the corresponding error signal is larger than a predetermined fail-threshold provided to the BIST circuit.

10. The apparatus of claim 8, wherein the functionality faults include nonlinearity, critical random errors, and electronic over-stress (EOS) faults, and wherein the gain-error monitor is configured to detect the functionality faults of the ADC without adversely affecting functionalities of the ADC.

11. The apparatus of claim 1, further comprising an ADC-to-ADC calibration module configured to:
  determine that an offset-correction path and a gain-correction path of the ADC are converged; and
  in response to the determination that offset-correction path and a gain-correction path of the ADC are converged, use a value of the relative offset associated with the reference sub-ADC as an offset value for another ADC, wherein each of the ADC and the other ADC are implemented by time-interleaving a plurality of sub-ADCs.

12. The apparatus of claim 1, wherein the calibration-signal generator is configured to generate the calibration signal that comprises:
  distinct values,
  a square wave with added white Gaussian Noise, and
  an adjustable amplitude.

13. The apparatus of claim 1, wherein the gain-correction path is configured to determine an amplitude for the calibration signal by:
  applying the calibration signal with an initial amplitude value to the reference sub-ADC, wherein the initial amplitude value comprises a highest value; and
  successively decrementing in a loop the possible subsequent amplitude values of the calibration signal to reach the amplitude for the calibration signal, for which the output signal of the reference sub-ADC is no longer clipped.

14. The apparatus of claim 1, further comprising a startup calibration module and a background calibration module, wherein:
  the startup calibration module is configured to perform a startup calibration after an initialization of a chip or following a cold start of the chip,
  the background calibration module is configured to perform the background calibration after the startup calibration and during normal operation of the chip, subsequent to a warm start following an idle state, or in response to an external return command,
  the startup calibration and the background calibration are bypass-able by external commands, and
  the idle state is reached after a freeze resulting from an external freeze command or a loss of signal.

15. An apparatus for correction of a timing impairment of a time-interleaved analog-to-digital converter (ADC), comprising:
  an interleaver circuit coupled to a plurality of sub-ADCs of the ADC and configured to receive clock signals and generate a plurality of current signals;
  a plurality of integrators configured to convert the plurality of current signals to a plurality of voltage signals that are applied to the plurality of sub-ADCs; and
  a gain-correction path configured to correct the timing impairment of the ADC based on using a calibration signal to adjust gains associated with the plurality of sub-ADCs,
  wherein:
  the timing impairment of the ADC is based on timing distortion associated with the clock signal and results in gain mismatch between the plurality of sub-ADCs, and
  adjusting gains associated with the plurality of sub-ADCs compensates for gain mismatches between the plurality of sub-ADCs.

16. The apparatus of claim 15, wherein the gain correction path is configured to adjust gains associated with the plurality of sub-ADCs by using different gain adjustments for the even sub-ADCs and odd sub-ADCs, and wherein the gain-correction path is configured to adjust gains associated with the plurality of sub-ADCs by:
  selecting a reference sub-ADC from the plurality of sub-ADCs;
  sending a calibration signal to an input node of each sub-ADC of the plurality of sub-ADCs; and
  for each sub-ADC of the plurality of sub-ADCs, other than the reference sub-ADC, generating a corresponding error signal based on output signals of the sub-ADC and the reference sub-ADC, and
  wherein:
  the gain-correction path is configured to calibrate each sub-ADC based on the corresponding error signal, and
  the reference sub-ADC has a lowest relative offset among the plurality of sub-ADCs.

17. The apparatus of claim 16, wherein:
  the gain-correction path is configured to select the reference sub-ADC from the plurality of sub-ADCs by measuring the offset of each sub-ADC of the plurality of sub-ADCs,
  when the ADC comprises a single-ended ADC, the gain-correction path is configured to select the reference sub-ADC from the plurality of sub-ADCs by measuring an offset of each sub-ADC of the plurality of sub-ADCs while the input node of that sub-ADC is shorted to ground potential,
  when the ADC comprises a differential ADC, the gain-correction path is configured to select the reference sub-ADC from the plurality of sub-ADCs by measuring an offset of each sub-ADC of the plurality of sub-ADCs while shorting to each other positive and negative inputs of the sub-ADC,
  the relative offset comprises an offset of the sub-ADC relative to a specified target offset value, and
  a value of the relative offset comprises an absolute value of a difference between the offset of the sub-ADC and the specified target offset value.

18. The apparatus of claim 17, wherein the gain-correction path is configured to act to reduce a mean-square difference between the output signals of that sub-ADC and the reference sub-ADC.

19. The apparatus of claim 16, wherein the gain-correction path is configured to:
  generate, for each sub-ADC, a corresponding gain-error signal based on the corresponding error signal;
  calibrate each sub-ADC based on the corresponding error signal by adjusting a corresponding reference voltage of each sub-ADC;
  adjust the corresponding reference voltage of each sub-ADC by modifying an input digital code to a corresponding gain-adjustment digital-to-analog converter (DAC) that generates the reference voltage of each sub-ADC;
  modify the input digital code to the corresponding gain-adjustment DAC based on the corresponding gain-error signal;
  generate the corresponding gain-error signal by using a product of three terms comprising the corresponding error signal, a sign of the output signal of the reference sub-ADC, and a software-controlled parameter and then accumulating the product in a second accumulator; and store a corresponding gain-correction including the modified input digital code to gain-adjustment DACs for later retrieval, and wherein the apparatus further comprises a gain error monitor configured to automatically detect a convergence of the gain-correction path.

20. An apparatus for correction of a timing impairment of a time-interleaved analog-to-digital converter (ADC), comprising:

an interleaver circuit coupled to a plurality of odd and even sub-ADCs of the ADC and configured to receive clock signals and generate a plurality of current signals;

a plurality of integrators configured to convert the plurality of current signals to a plurality of voltage signals that are applied to the plurality of sub-ADCs; and a comparator configured to determine timing impairment of the ADC based on a comparison between an average gain of the odd sub-ADCs with an average gain of the even sub-ADCs, wherein:

the timing impairment of the ADC is based on timing distortions associated with the clock signals, and results in gain mismatch between the even sub-ADCs and odd sub-ADCs, and the timing impairment of the ADC is correctable based on adjusting timings associated with the clock signals.

* * * * *